(12) United States Patent
Hu et al.

(10) Patent No.: US 9,357,647 B2
(45) Date of Patent: May 31, 2016

(54) PACKAGING SUBSTRATE, METHOD FOR MANUFACTURING SAME, AND CHIP PACKAGING BODY HAVING SAME

(71) Applicant: Zhen Ding Technology Co., Ltd., Tayuan, Taoyuan (TW)

(72) Inventors: Chu-Chin Hu, Taoyuan (TW); Shih-Ping Hsu, Taoyuan (TW); E-Tung Chou, Taoyuan (TW); Chih-Jen Hsiao, Taoyuan (TW)

(73) Assignee: Zhen Ding Technology Co., Ltd., Tayuan, Taoyuan (TW)

( * ) Notice: Subject to any disclaimer, the term of this patent is extended or adjusted under 35 U.S.C. 154(b) by 156 days.

(21) Appl. No.: 13/971,854

(22) Filed: Aug. 21, 2013

(65) Prior Publication Data
US 2014/0078706 A1 Mar. 20, 2014

(30) Foreign Application Priority Data
Sep. 17, 2012 (CN) .......................... 2012 1 03434446

(51) Int. Cl.
H05K 1/11 (2006.01)
H01L 23/498 (2006.01)
(Continued)

(52) U.S. Cl.
CPC ............ *H05K 1/112* (2013.01); *H01L 21/4853* (2013.01); *H01L 21/6835* (2013.01); *H01L 23/49816* (2013.01); *H01L 21/568* (2013.01); *H01L 23/3128* (2013.01); *H01L 24/32* (2013.01); *H01L 24/45* (2013.01); *H01L 24/48* (2013.01); *H01L 24/73* (2013.01); *H01L 2221/68345* (2013.01); *H01L 2224/2919* (2013.01); *H01L 2224/32225* (2013.01); *H01L 2224/45144* (2013.01); *H01L 2224/48091* (2013.01);
(Continued)

(58) Field of Classification Search
CPC .............. H01L 21/4853; H01L 21/568; H01L 2224/2919; H01L 2224/32225; H01L 2224/45144; H05K 3/0097; H05K 2201/0305
See application file for complete search history.

(56) References Cited

U.S. PATENT DOCUMENTS

2005/0012225 A1* 1/2005 Choi ..................... H01L 21/568
257/782
2010/0065948 A1* 3/2010 Bae ....................... H01L 21/563
257/621
2011/0154657 A1* 6/2011 Chuang ................ H05K 3/0097
29/829

FOREIGN PATENT DOCUMENTS

CN 101515574 A 8/2009
CN 102598324 A 7/2012
(Continued)

Primary Examiner — Keith Hendricks
Assistant Examiner — Stefanie S Wittenberg
(74) Attorney, Agent, or Firm — Novak Druce Connolly Bove + Quigg LLP

(57) ABSTRACT

A packaging substrate includes a supporting sheet, a copper foil, a number of connecting pads, a number of solder balls, a resin layer, a wiring layer and a solder mask layer. The copper foil is attached on a surface of the supporting sheet through an adhesive sheet. The connecting pads are formed on the copper foil. The solder balls are formed on the connecting pads. The resin layer infills the gaps between the solder balls. The wiring layer is formed on the resin layer and the solder balls. Terminal portions of the solder balls facing away from the connecting pads are electrically connected to the wiring layer. The solder mask layer is formed on the wiring layer. The solder mask layer defines a number of openings exposing portions of the wiring layer. The portions of the wiring layer exposed through the openings serve as contact pads.

7 Claims, 31 Drawing Sheets

(51) Int. Cl.
*H01L 21/48* (2006.01)
*H01L 21/683* (2006.01)
*H01L 23/31* (2006.01)
*H01L 21/56* (2006.01)
*H01L 23/00* (2006.01)

(52) U.S. Cl.
CPC ............ *H01L2224/48228* (2013.01); *H01L 2224/73104* (2013.01); *H01L 2224/73265* (2013.01); *H01L 2924/00014* (2013.01); *H01L 2924/15311* (2013.01)

(56) References Cited

FOREIGN PATENT DOCUMENTS

| | | |
|---|---|---|
| TW | 200737434 A | 10/2007 |
| TW | 200839999 A | 10/2008 |
| TW | 200921818 A | 5/2009 |
| TW | 200924140 A1 | 6/2009 |
| TW | 200926315 A1 | 6/2009 |
| TW | 200929467 A1 | 7/2009 |
| TW | 200950039 A | 12/2009 |

\* cited by examiner

PACKAGING SUBSTRATE, METHOD FOR MANUFACTURING SAME, AND CHIP PACKAGING BODY HAVING SAME

BACKGROUND

1. Technical Field

The present disclosure relates to chip packaging technology, and particularly to a packaging substrate, a method for manufacturing the packaging substrate, and a chip packaging body having the packaging substrate.

2. Description of Related Art

Chip packaging structure may include a packaging substrate and a chip. The PCB is configured to form a connecting pad. A typical packaging substrate includes a dielectric layer, two wiring layers arranged on opposite sides of the dielectric layer and a plurality of conductive vias formed in the dielectric layer, the vias being electrically connected to the two wiring layers. However, the conductive vias are formed through an electroplating method, which is complex and consumes too much time.

What is needed therefore is a packaging substrate, a method for manufacturing the packaging substrate, and a chip packaging body having the packaging substrate, to overcome the described limitations.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

FIGS. 1-16 show a method for manufacturing a packaging structure according to a first exemplary embodiment which includes the following steps.

Figure 1:
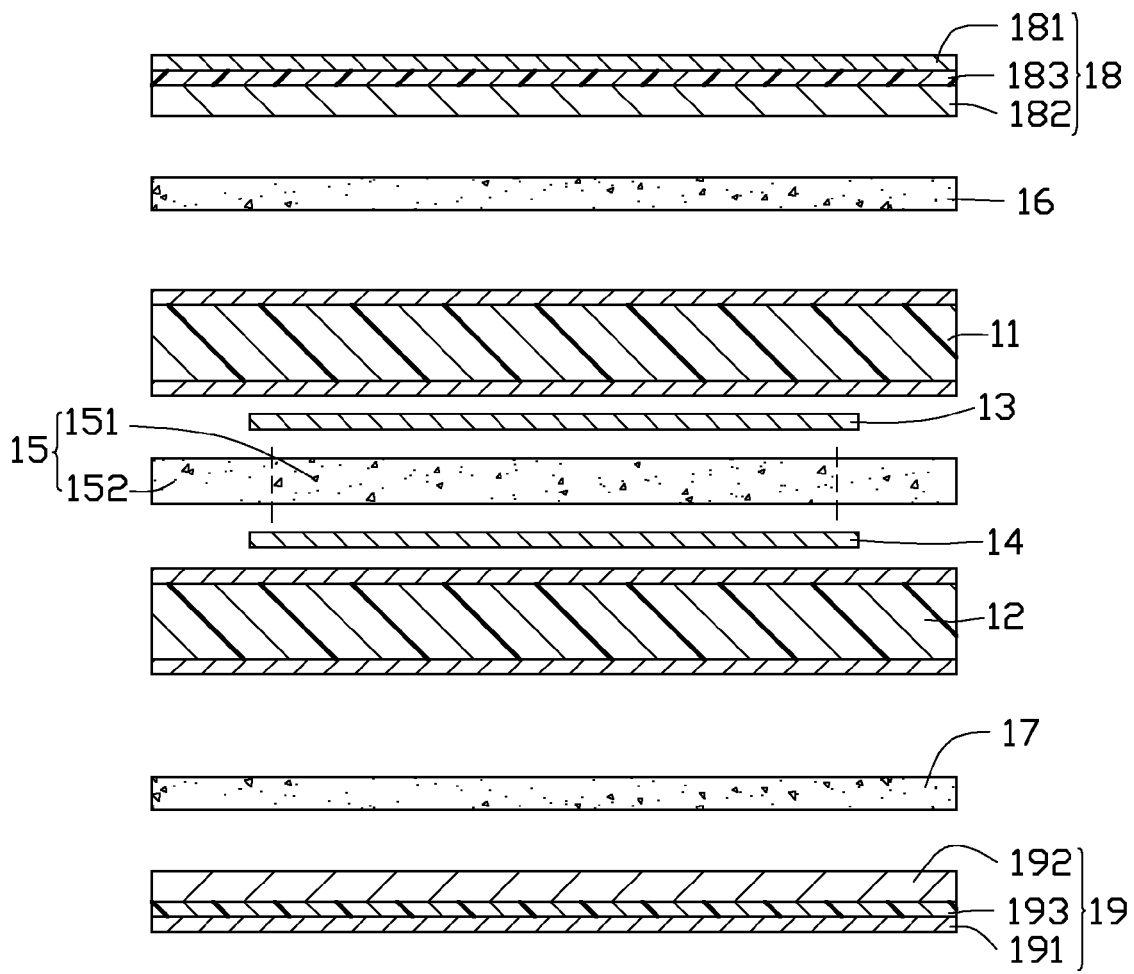
FIG. 1 shows a first double-sided copper clad laminate (CCL), a second double-sided copper clad laminate, a first copper foil, a second copper foil, a first adhesive sheet, a second adhesive sheet, a third adhesive sheet, a first copper foil substrate, and a second copper foil substrate according to a first exemplary embodiment.

FIG. 1, shows that in step 1, a first double-sided copper clad laminate 11 is provided, together with a second double-sided copper clad laminate 12, a first copper foil 13, a second copper foil 14, a first adhesive sheet 15, a second adhesive sheet 16, a third adhesive sheet 17, a first copper foil substrate 18 and a second copper foil substrate 19.

The first double-sided copper clad laminate 11, the second double-sided copper clad laminate 12, the first adhesive sheet 15, the second adhesive sheet 16 and the third adhesive sheet 17 have a same shape and area. The first copper foil 13 and the second copper foil 14 have a same shape as the first copper clad laminate 11, and have an area smaller than that of the first copper clad laminate 11. The first adhesive sheet 15 includes a central portion 151 and a peripheral portion 152 surrounding the central portion 151. The central portion 151 has a shape same as that of the first and second copper foils 13 and 14. The central portion 151 has an area slightly smaller than that of the first and second copper foils 13 and 14.

The first copper foil substrate 18 includes a third copper foil 181, a fourth copper foil 182 and a first adhesive layer 183 sandwiched between the third copper foil 181 and the fourth copper foil 182. The fourth copper foil 182 is thicker than the third copper foil 181. Preferably, the third copper foil 181 has a thickness of about 5 micrometers, and the fourth copper foil 182 has a thickness of about 18 micrometers. A thickness of the first adhesive layer 183 is in the range from about 2 micrometers to about 5 micrometers. In this embodiment, the first adhesive layer 183 is comprised of a peelable adhesive, such as a PET release film. The second copper foil substrate 19 is identical to the first copper foil substrate 18. The second copper foil substrate 19 includes a fifth copper foil 191 corresponding to the third copper foil 181, a sixth copper foil 192 corresponding to the fourth copper foil 182, and a second adhesive layer 193 corresponding to the first adhesive layer 183.

Figure 2:
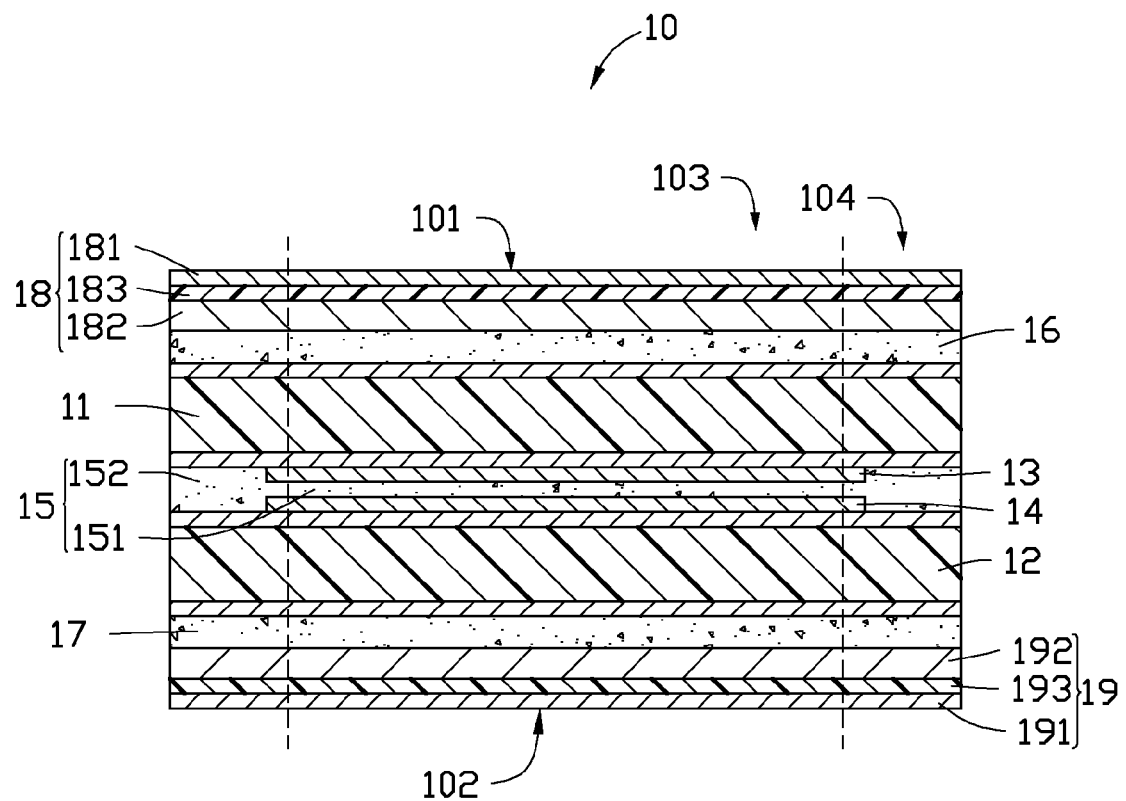
FIG. 2 is a schematic, cross-sectional view of a supporting substrate obtained by laminating the first copper foil substrate, the second adhesive sheet, the first double-sided copper clad laminate, the first copper foil, the first adhesive sheet, the second copper foil, the second double-sided copper clad laminate, the third adhesive sheet, and the second copper foil substrate of FIG. 1 onto each other in that order.

FIG. 2 shows that in step 2, the first copper foil substrate 18, the second adhesive sheet 16, the first double-sided copper clad laminate 11, the first copper foil 13, the first adhesive sheet 15, the second copper foil 14, the second double-sided copper clad laminate 12, the third adhesive sheet 17, and the second copper foil substrate 19 are laminated together to form a supporting substrate 10. The fourth copper foil 182 of the first copper foil substrate 18 is adjacent to the second adhesive sheet 16. The sixth copper foil 192 of the second copper foil substrate 19 is adjacent to the third adhesive sheet 17.

In the laminating process of step 1, the first copper foil substrate 18, the second adhesive sheet 16, the first double-sided copper clad laminate 11, the first copper foil 13, the first adhesive sheet 15, the second copper foil 14, the second double-sided copper clad laminate 12, the third adhesive sheet 17, and the second copper foil substrate 19 are aligned with each other. The first copper foil 13 contacts the first double-sided copper clad laminate 11, and covers and bonds the entire central portion 151 of the first adhesive sheet 15 and a portion of the peripheral portion 152 surrounding the central portion 151. The second copper foil 14 contacts the second double-sided copper clad laminate 12, and covers and bonds the entire central portion 151 of the first adhesive sheet 15 and a portion of the peripheral portion 152 surrounding the central portion 151. That is, the central portion 151 of the first adhesive sheet 15 and the first doubled-sided copper clad laminate 11 are spaced by the first copper foil 13, and the central portion 151 and the second double-sided copper clad laminate 12 are spaced by the second copper foil 14. A portion of the peripheral portion 152 which is not covered by the first copper foil 13 and the second copper foil 14 directly bonds the first copper clad laminate 11 and the second copper clad laminate 12.

The supporting substrate 10 includes a first surface 101 and an opposite second surface 102. A surface of the third copper foil 181 serves as the first surface 101. A surface of the fifth copper foil 191 serves as the second surface 102.

The supporting substrate 10 includes a product portion 103 and an unwanted portion 104 surrounding the product portion 103. An orthogonal projection of the product portion 103 on the first adhesive sheet 15 has a same shape as the central portion 151 and an area equal to the central portion 151. The orthogonal projection of the product portion 103 on the first adhesive sheet 15 is aligned with the central portion 151.

In an alternative embodiment, the first and second copper foils 13 and 14 can be omitted. That is, opposite sides of the first adhesive 15 bond the first double-sided copper clad laminate 11 and the second double-sided copper clad laminate 12 with no space between. Correspondingly, the first adhesive sheet 15 is a peelable adhesive, such as a PET release film.

Figure 3:
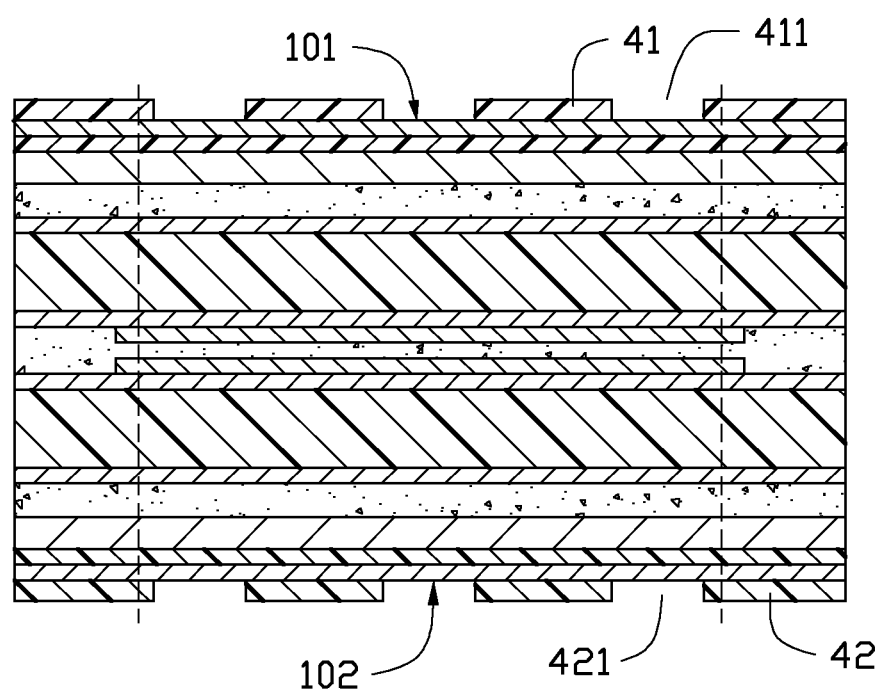
FIG. 3 shows a photo-resist layer formed on each of the first and second copper foil substrates.
Figure 4:
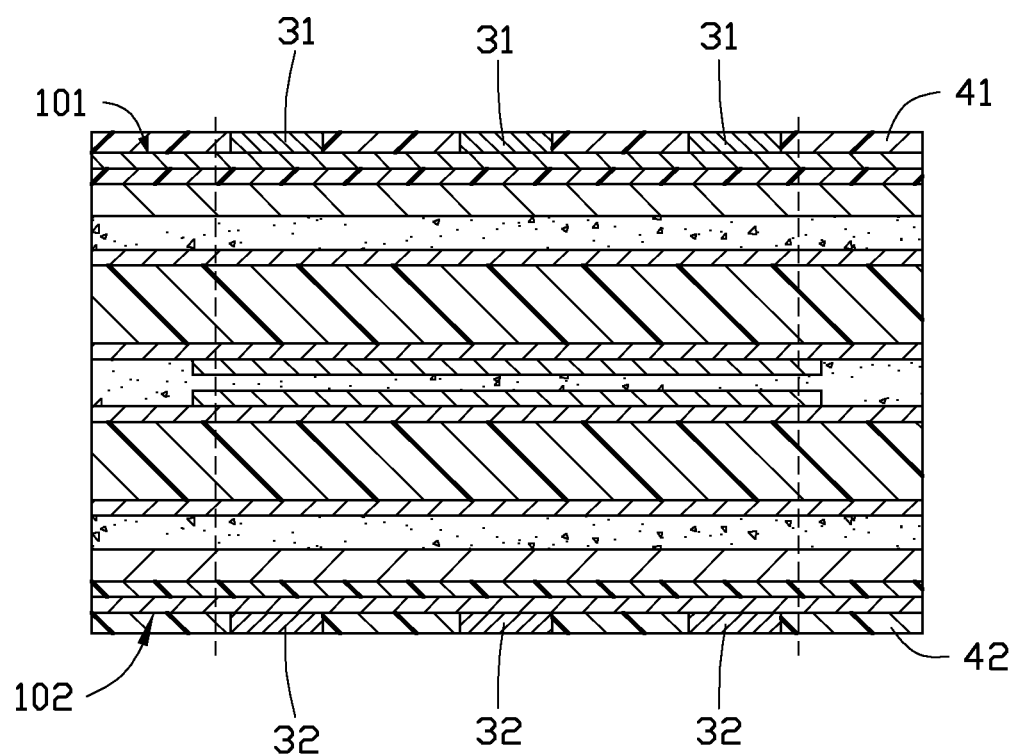
FIG. 4 shows connecting pads formed on the first copper foil substrate and the second copper foil substrate based on the photo-resist layers in FIG. 3.
Figure 5:
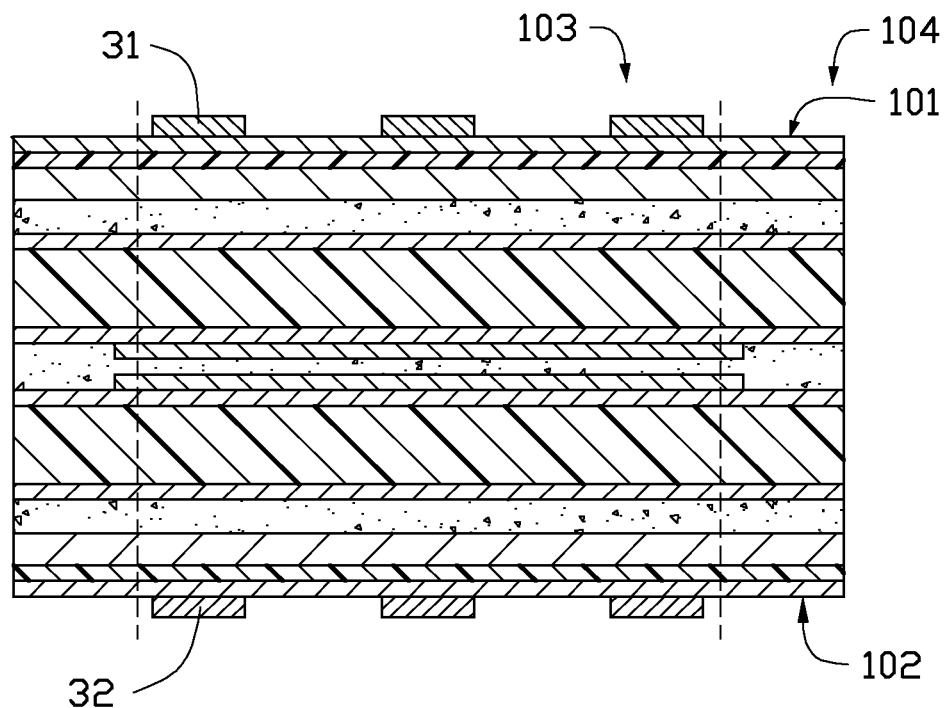
FIG. 5 shows the photo-resist layers in FIG. 4 removed.

FIGS. 3-5 show that in step 3, a plurality of first connecting pads 31 is formed on the first surface 101, and a plurality of second connecting pads 32 is formed on the second surface 102. The first and second connecting pads 31 and 32 are located in the product portion 103 of the supporting substrate 10.

A method for manufacturing the first connecting pads 31 and the second connecting pads 32 is described as follows. FIG. 3 shows a first photo-resist layer 41 formed on the first surface 101, and a second photo-resist layer 42 formed on the second surface 102. In this embodiment, the first and second photo-resist layers 41 and 42 are dry-film photo-resist. The first photo-resist layer 41 defines a plurality of first openings 411, which expose portions of the third copper foil 181. The second photo-resist layer 42 defines a plurality of second openings 421, which expose portions of the fifth copper foil 191. FIG. 4 shows the first openings 411 and the second openings 421 filled with copper by an electroplating method, thereby obtaining the first and second connecting pads 31 and 32. FIG. 5 shows that the first and second photo-resist layers 41 and 42 are removed.

Figure 6:
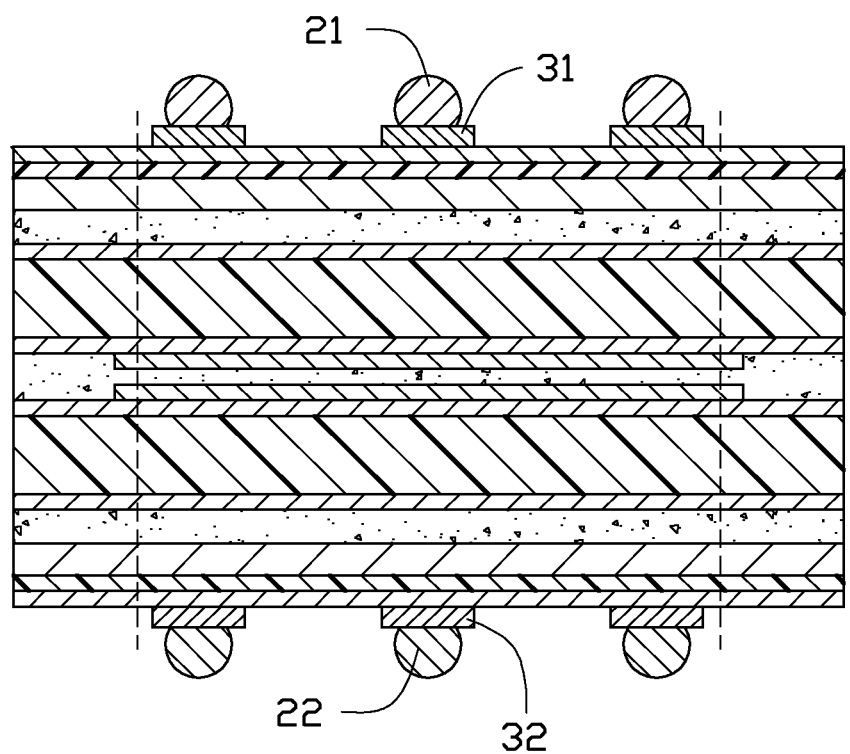
FIG. 6 shows solder balls formed on the connecting pads in FIG. 5.

FIG. 6 shows that in step 4, a first solder ball 21 is implanted on each of the first connecting pads 31, and a second solder ball 22 is implanted on each of the second connecting pads 32, using a method known in the art. The first and second solder balls 21 and 22 can be tin.

Figure 7:
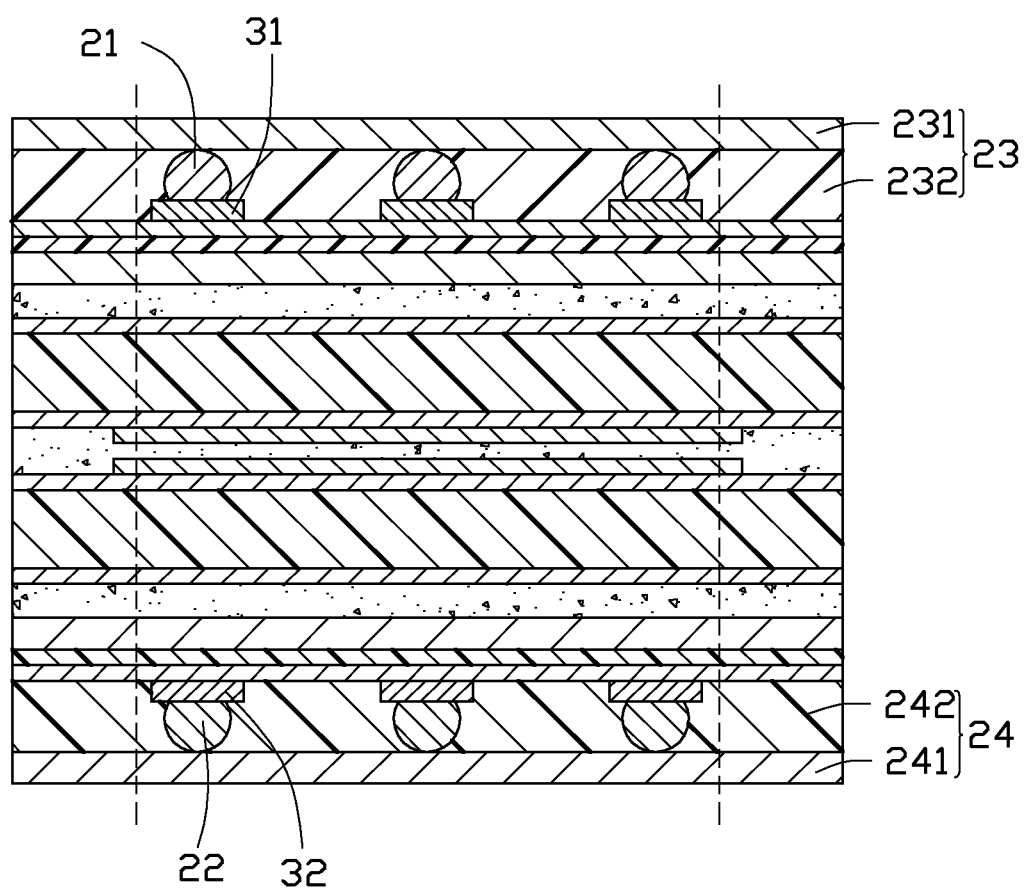
FIG. 7 shows resin coated copper coil formed on the connecting pads and each of the first and second copper foil substrates in FIG. 6.

FIG. 7 shows that in step 5, a first resin coated copper foil 23 is laminated on the first solder balls 21, and a second resin coated copper foil 24 is laminated on the second solder balls 22. The first resin coated copper foil 23 includes a seventh copper foil 231 and a first resin layer 232 coated on a surface of the seventh copper foil 231. The second resin coated copper foil 24 includes an eighth copper foil 241 and a second resin layer 242 coated on a surface of the eighth copper foil 241. The first resin layer 232 covers surfaces of the first solder balls 21 and infills the gap between the first solder balls 21. The second resin layer 242 covers surfaces of the second solder balls 22 and infills the gap between the second solder balls 22. Terminal portions of the first solder balls 21 facing away from the first connecting pads 31 contact and are electrically connected to the seventh copper foil 231. Terminal portions of the second solder balls 22 facing away from the second connecting pads 32 contact and are electrically connected to the eighth copper foil 241.

Figure 8:
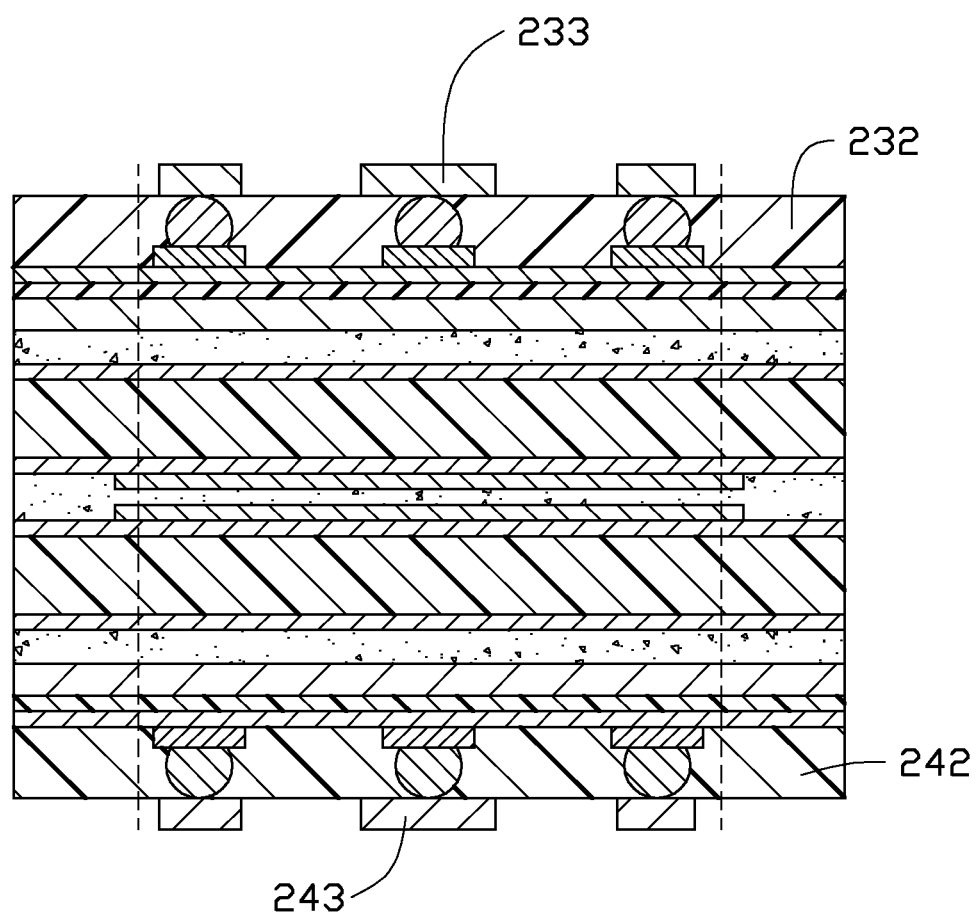
FIG. 8 shows copper foil layers of the resin coated copper in FIG. 7 partly removed to form wiring layers.

FIG. 8 shows that in step 6, the seventh copper foil 231 is selectively etched to form a patterned first wiring layer 233, and the eighth copper foil 241 is selectively etched to form a patterned second wiring layer 243.

Figure 9:
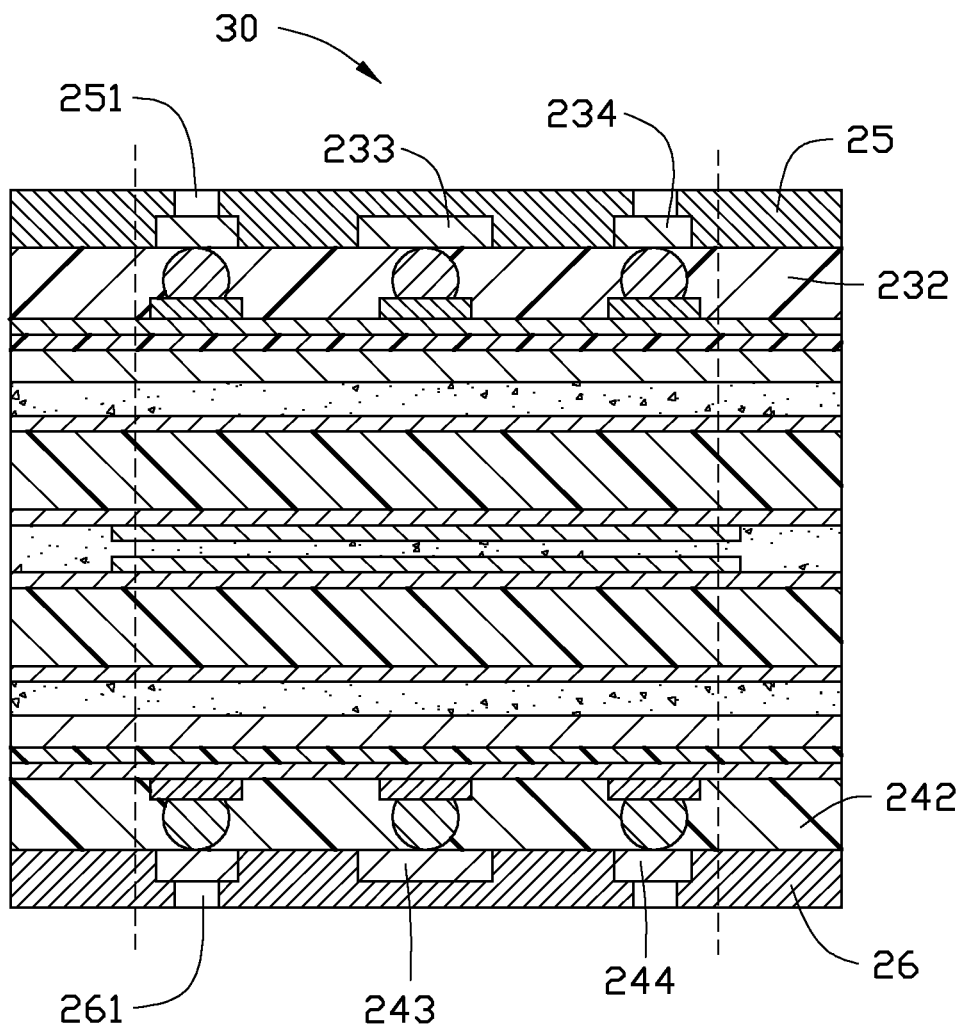
FIG. 9 shows solder mask layers covering the wiring layers in FIG. 8 and exposing contact pads.

FIG. 9 shows that in step 7, a first solder mask layer 25 is formed on the first wiring layer 233, and a second solder mask layer 26 is formed on the second wiring layer 243. Thus, a multi-layer structure 30 is obtained.

The first solder mask layer 25 defines a plurality of third openings 251 to expose portions of the first wiring layer 233. The second solder mask layer 26 defines a plurality of fourth openings 261 to expose portions of the second wiring layer 243. The portions of the first wiring layer 233 exposed through the third openings 251 serve as first contact pads 234. The portions of the second wiring layer 243 exposed through the fourth openings 261 serve as second contact pads 244. The first and second solder mask layers 25 and 26 can be formed by coating and then drying solder resist ink on the first wiring layer 233 and the second wiring layer 243.

Figure 10:
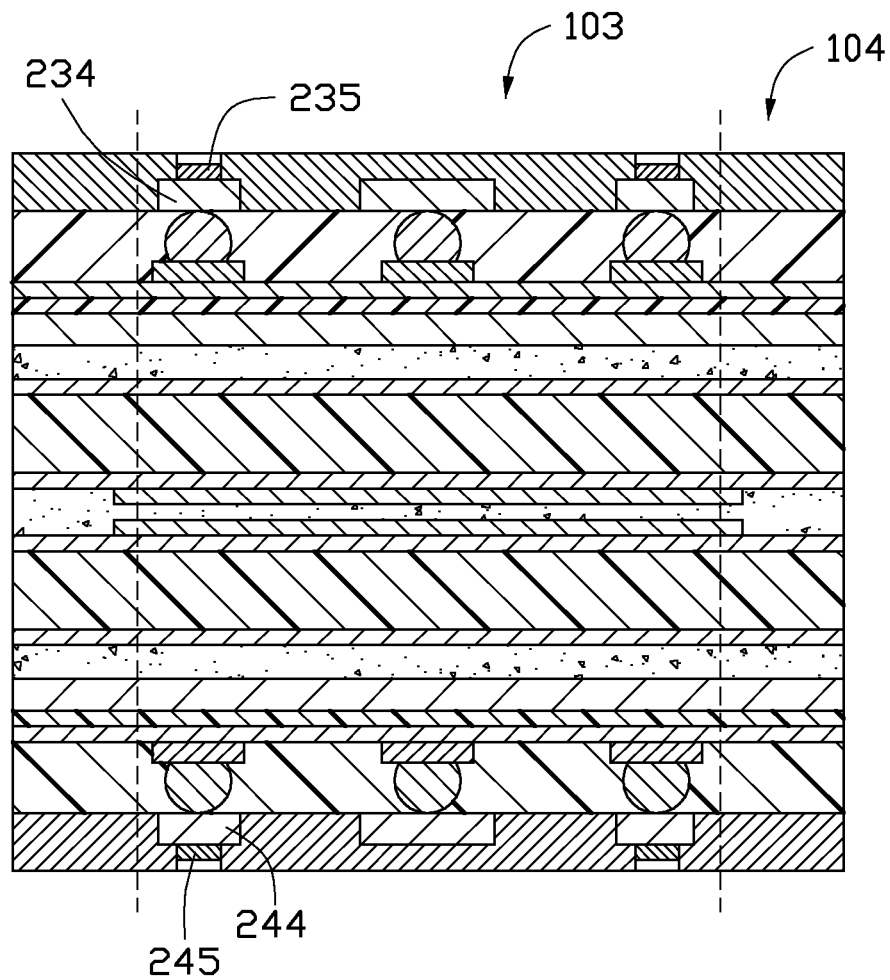
FIG. 10 shows surface plating layers formed on the contact pads in FIG. 9.

FIG. 10 shows that in step 8, a first surface plating layer 235 is formed on each of the first contact pads 234, and a second surface plating layer 245 is formed on each of the second contact pads 244.

The first surface plating layer 235 and the second surface plating layer 245 can be formed by a plating of gold, of nickel-gold, of nickel-palladium-gold or of tin. The first and second surface plating layers 235 and 245 protect the first and second contacts 234 and 245 from oxidation, and is beneficial for the connection to gold wires of a chip in a later step.

Figure 11:
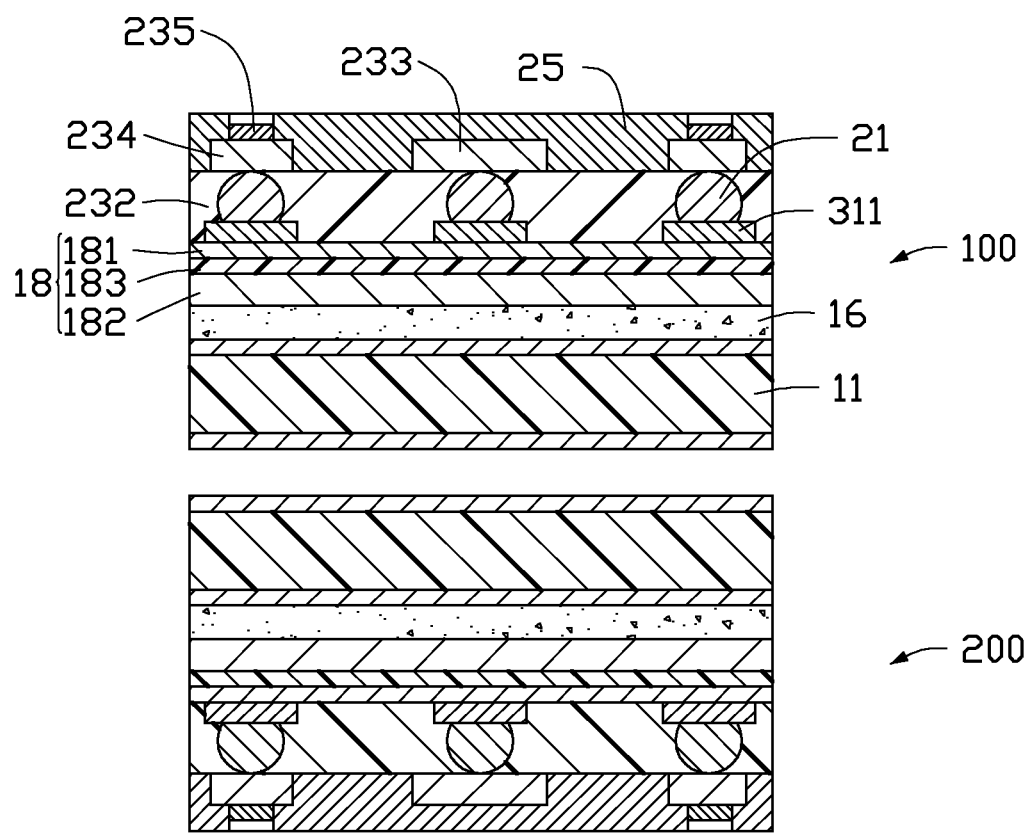
FIG. 11 shows the multilayer structure of FIG. 10 separated, obtaining a first packaging substrate and a second packaging substrate.

FIG. 11 shows that in step 9, a portion of the multi-layer structure 30 aligned with the unwanted portion 104 is removed. Thus, a first packaging substrate 100 and a second packaging substrate 200 are separated from each other and are respectively obtained.

The portion of the multi-layer structure 30 aligned with the unwanted portion 104 is removed by cutting or punching the multi-layer structure 30 along a borderline between the product portion 103 and the unwanted portion 104.

Because the first copper foil 13 and the second copper foil 14 cover the entire central portion 151 of the first adhesive sheet 15, the first adhesive sheet 15 does not adhere to the first double-sided copper clad laminate 11 and the second double-sided copper clad laminate 12 in the product portion 103 after the unwanted portion 104 is removed. The first copper foil 13 and the first double-sided copper clad laminate 11 are easily separated from each other because there is no bonding between the first copper foil 13 and the first double-sided copper clad laminate 11. Similarly, the second copper foil 14 and the second double-sided copper clad laminate 12 are easily separated from each other. Thus, the first double-sided copper clad laminate 11 and the second double-sided copper clad laminate 12 are separated from each other.

When the first and second copper foils 13 and 14 are omitted, the first packaging substrate 100 and the second packaging substrate 200 are separated from each other by removing the first adhesive sheet 15, such as by peeling the first adhesive sheet 15.

The first packaging substrate 100 is identical to the second packaging substrate 200. Thus, the first packaging substrate 100 is taken as an example for describing how a chip is mounted on the first packaging substrate 100 in the following steps.

The first and second double-sided copper clad laminate 11 and 12 reinforce and protect the layers of the first and second packaging substrates 100 and 200 in the process of manufacturing the first and second packaging substrates 100 and 200. The first and second double-sided copper clad laminates 11 and 12 can be used instead of a polyimide (PI) sheet, a glass fiber laminate or a copper sheet.

Figure 12:
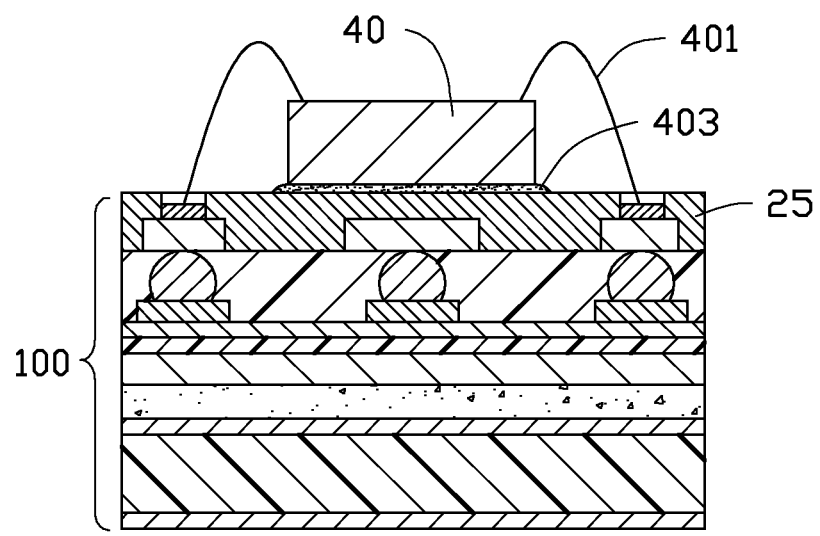
FIG. 12 shows a chip attached on the first packaging substrate in FIG. 11.
Figure 13:
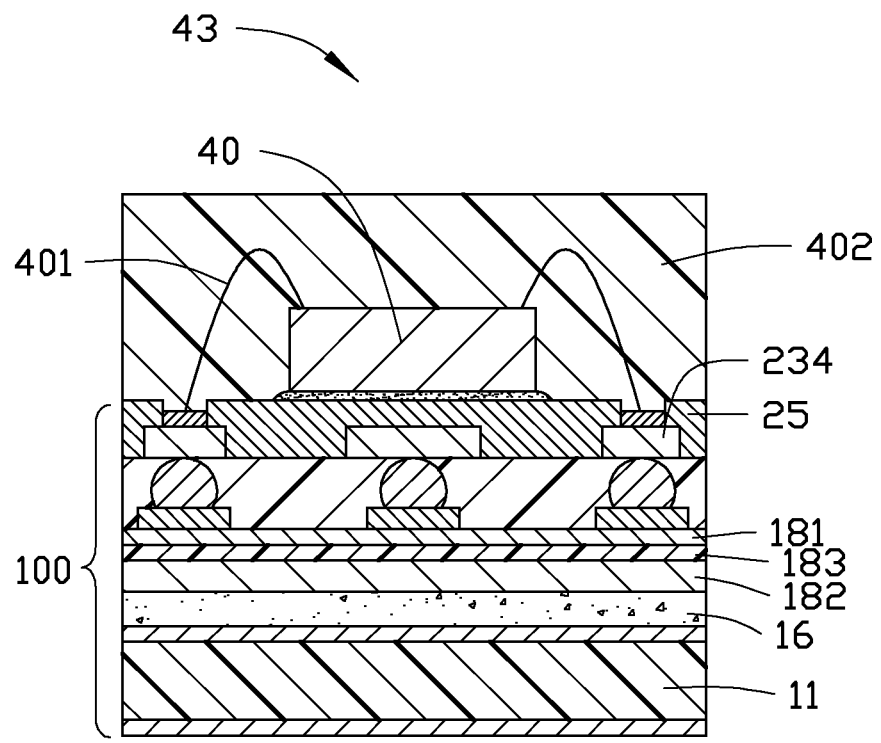
FIG. 13 shows a molding compound layer formed on the first packaging substrate and the chip in FIG. 12.

FIGS. 12 and 13 show that in step 10, a chip 40 is mounted on the first packaging substrate 100 and is electrically connected to the first packaging substrate 100.

In detail, FIG. 12 shows that the chip 40 is fixed on the first solder mask layer 25 through an adhesive layer 403. The chip 40 includes a plurality of electrodes (not shown) and a plurality of bonding wires 401 in connection with the electrodes. A terminal portion of the bonding wires 401 is soldered to the surface plating layers 235 on the first contact pads 234, thereby electrically connecting the chip 40 to the first wiring layer 233. The bonding wires 401 can be gold. FIG. 13 shows a molding compound layer 402 applied on the chip 40 and the packaging substrate 100 to entirely cover the bonding wires 401, the chip 40, an exposed portion of the first solder mask layer 25 and the surface plating layers 235 on the first contact pads 234. In this embodiment, the molding compound layer 402 can be thermosetting resin, for example, polyimide resin, epoxy resin, or silicone resin, for example.

Figure 14:
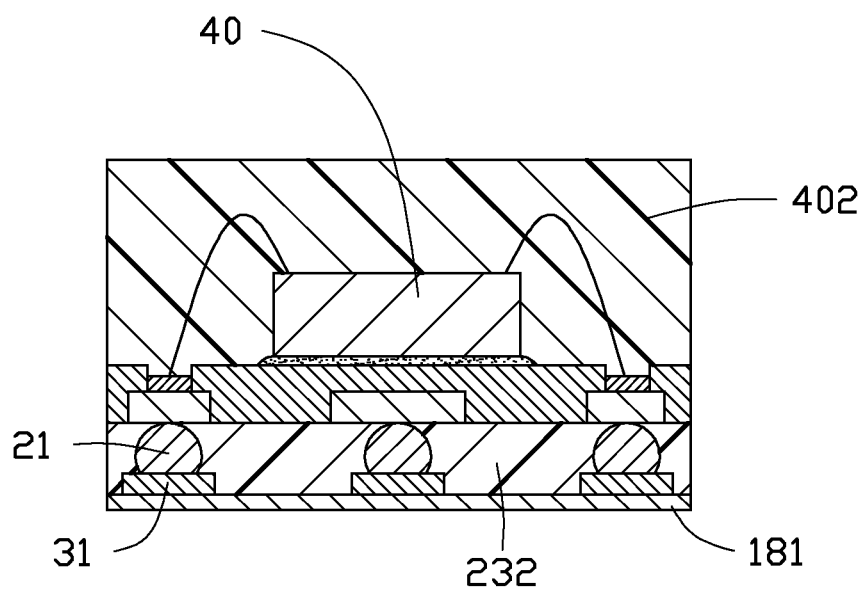
FIG. 14 shows the first copper clad laminate, the second adhesive sheet, and a fourth copper foil of the first copper foil substrate in FIG. 13 removed.

FIG. 14 shows that in step 11, the first double-sided copper clad laminate 11, the second adhesive sheet 16, the fourth copper foil 182 and the first adhesive layer 183 are removed. Because the third copper foil 181 adjacent to the first adhesive layer 183 is thinner than the fourth copper foil 182, the first double-sided copper clad laminate 11, the second adhesive sheet 16, the fourth copper foil 182 and the first adhesive layer 183 can be removed by peeling the first adhesive layer 183 from the third copper foil 181.

Figure 15:
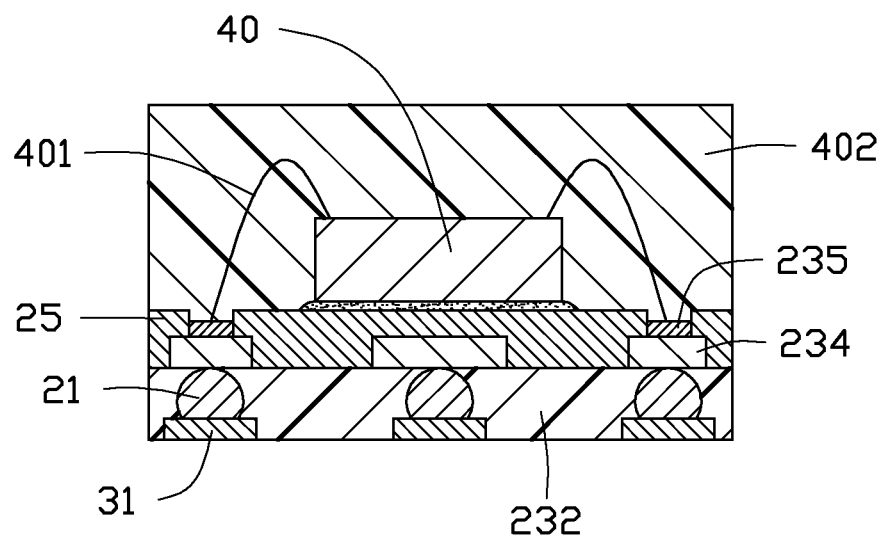
FIG. 15 shows a third copper foil attached on a first insulating layer of the resin coated copper foil in FIG. 14 removed.

FIG. 15 shows that in step 12, the third copper foil 181 is removed. The third copper foil 181 can be removed by a micro-etching method. Thus, the first contact pads 31 are exposed.

Figure 16:
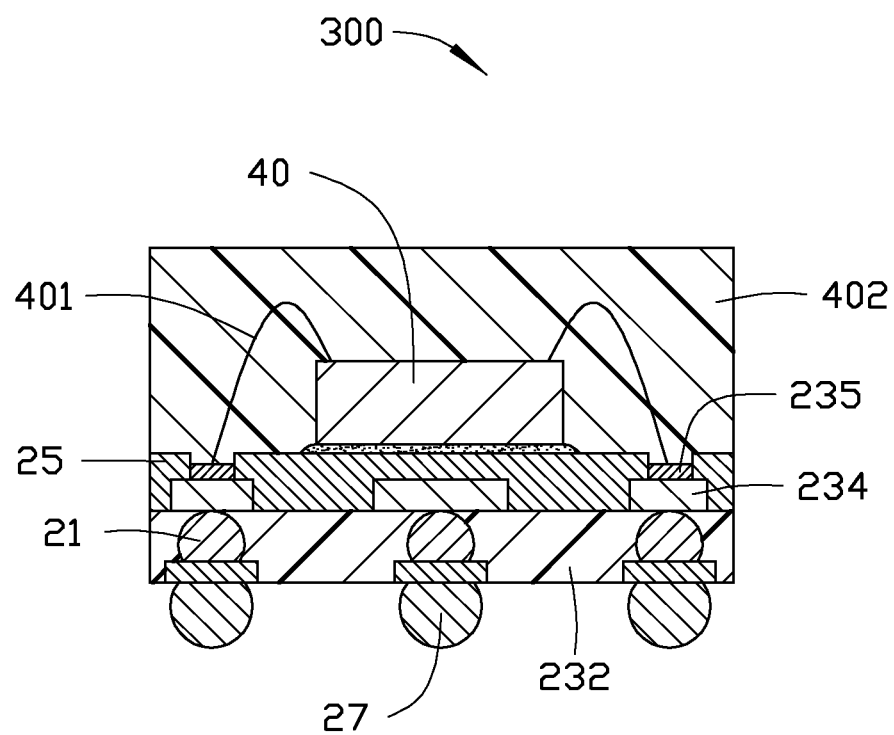
FIG. 16 shows solder balls formed on a side of the connecting pads facing away from the contact pads.

FIG. 16 shows that in step 13, a third solder ball 27 are implanted on each of the first contact pads 31, thereby obtaining a chip packaging body 300.

The chip packaging body 300 of this embodiment includes a first resin layer 232, a plurality of first connecting pads 31, a first wiring layer 233, a plurality of first solder balls 21, a first solder mask layer 25, a chip 40, a molding compound layer 402 and a plurality of third solder balls 27. The first connecting pads 31 are embedded in a surface of the first resin layer 232. The first wiring layer 233 is arranged on another surface of the first resin layer 232 facing away from the first connecting pads 31. The first wiring layer 233 is electrically connected to the first connecting pads 31 through the first solder balls 21 located in the first resin layer 232. Each of the connecting pads 31 is electrically connected to a first solder ball 21. The first solder mask layer 25 is formed on the first wiring layer 233. The first solder mask layer 25 defines a plurality of third openings 251 to expose portions of the first wiring layer 233. The portions of the first wiring layer 233 exposed through the third openings 251 serve as first contact pads 234. The chip 40 includes a plurality of bonding wires 401 electrically connecting the chip and the first contact pads 234. The molding compound layer 402 entirely covers the bonding wires 401, the chip 40, an exposed portion of the first solder mask layer 25 and the first contact pads 234. The third solder balls 27 are formed on a side of the first connecting pads 31 facing away from the first solder balls 21.

In this embodiment, the first wiring layer 233 is electrically connected to the first connecting pads 31 through the first solder balls 21 instead of through conductive vias. The method of forming the first solder balls 21 is easier than the method of forming the conductive vias. In addition, the electroplating method for making the conductive vias of the related art consumes much water and needs a liquid waste treatment process. The method of forming the first solder balls 21 does not require water and the liquid waste treatment process, which is more environmentally friendly.

FIGS. 17-31 show a method for manufacturing a packaging structure according to a second exemplary embodiment includes the following steps.

Figure 17:
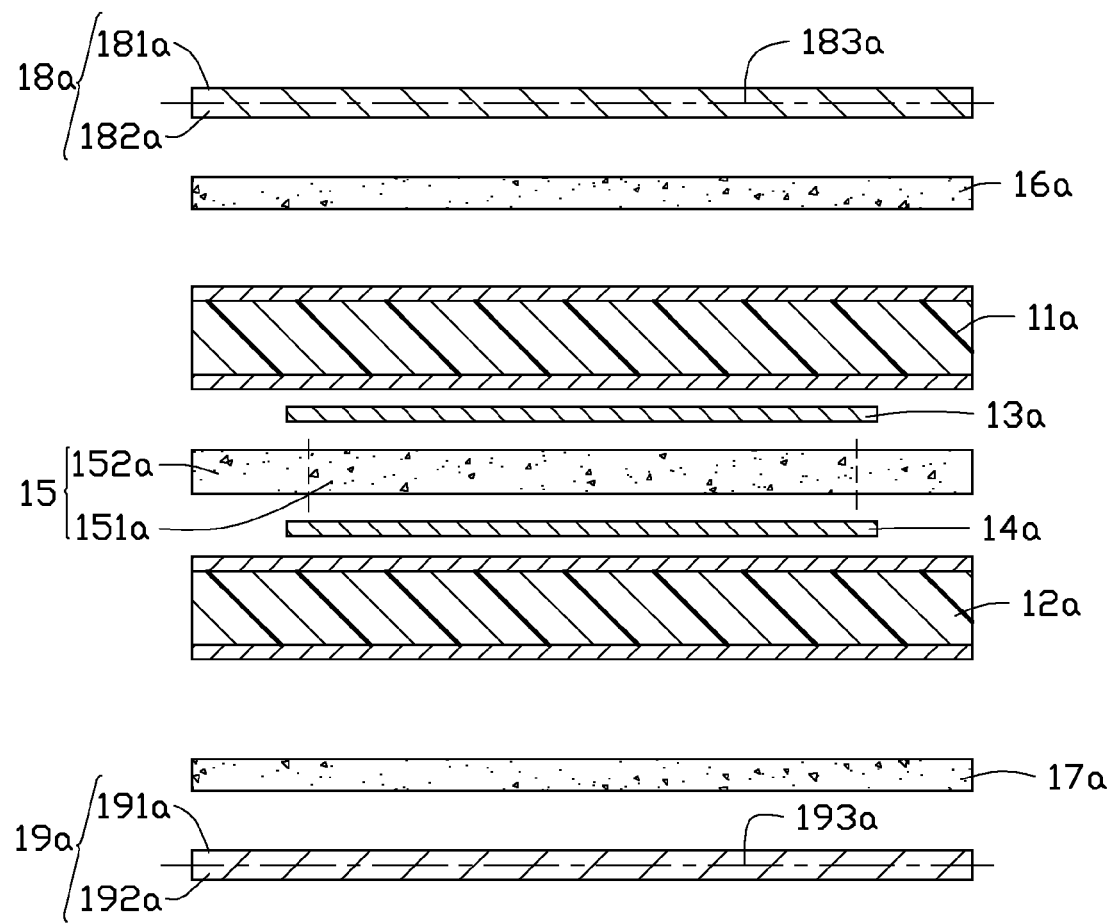
FIG. 17 shows a first double-sided copper clad laminate (CCL), a second double-sided copper clad laminate, a first copper foil, a second copper foil, a first adhesive sheet, a second adhesive sheet, a third adhesive sheet, a third copper foil, and a fifth copper foil according to a second exemplary embodiment.

FIG. 17 shows that in step (1), a first double-sided copper clad laminate 11a is provided, together with a second double-sided copper clad laminate 12a, a first copper foil 13a, a second copper foil 14a, a first adhesive sheet 15a, a second adhesive sheet 16a, a third adhesive sheet 17a, a third copper foil 18a and a fifth copper foil 19a.

In this embodiment, the first double-sided copper clad laminate 11a, the second double-sided copper clad laminate 12a, the first copper foil 13a, the second copper foil 14a, the first adhesive sheet 15a, and the second adhesive sheet 16a are respectively identical to the first double-sided copper clad laminate 11, the second double-sided copper clad laminate 12, the first copper foil 13, the second copper foil 14, the first adhesive sheet 15, and the second adhesive sheet 16 of the first exemplary embodiment. A thickness of the third copper foil 18a and the fifth copper foil 19a is preferably equal to or greater than about 18 micrometers.

The third copper foil 18a is a single body of material comprising an outer first copper layer 181a and an underlying second copper layer 182a. The fifth copper foil 19a is single body of material comprising an outer third copper layer 191a and an underlying fourth copper layer 192a. As shown in FIG. 17, the first copper layer 181a and the second copper layer 182a are partitioned by an imaginary line 183a, and the third copper foil 191a and the fourth copper layer 192a are partitioned by an imaginary line 193a. In this embodiment, the first copper layer 181a has a thickness equal to the second copper layer 182a, and the third copper layer 191a has a thickness equal to the fourth copper layer 192a.

Figure 18:
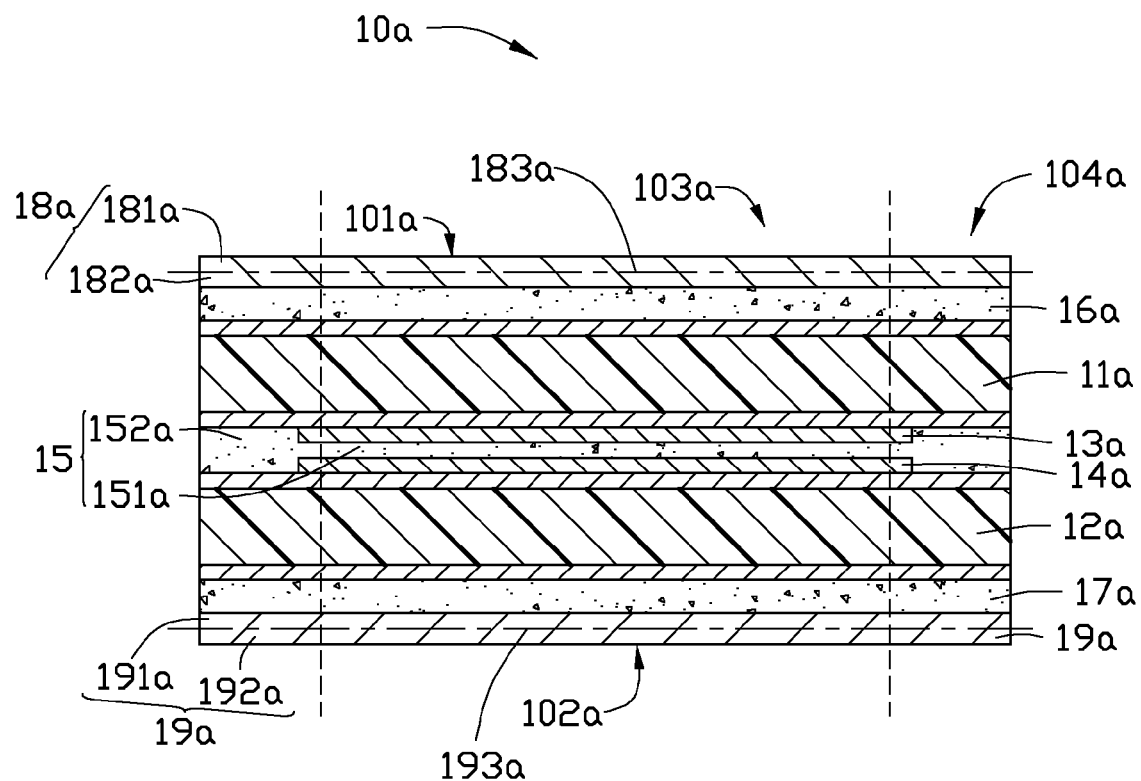
FIG. 18 is a schematic, cross-sectional view of a supporting substrate obtained by laminating the third copper foil, the second adhesive sheet, the first double-sided copper clad laminate, the first copper foil, the first adhesive sheet, the second copper foil, the second double-sided copper clad laminate, the third adhesive sheet, and the fifth copper foil of FIG. 17 onto each other in that order.

FIG. 18 shows that in step (2), the third copper foil 18a, the second adhesive sheet 16a, the first double-sided copper clad laminate 11a, the first copper foil 13, the first adhesive sheet 15, the second copper foil 14, the second double-sided copper clad laminate 12, the third adhesive sheet 17, and the fifth copper foil 19a are laminated together to form a supporting substrate 10a.

In the laminating process of step (2), the third copper foil 18a, the second adhesive sheet 16a, the first double-sided copper clad laminate 11a, the first copper foil 13a, the first adhesive sheet 15a, the second copper foil 14a, the second double-sided copper clad laminate 12a, the third adhesive sheet 17a, and the fifth copper foil 19 are aligned with each other. The first copper foil 13a contacts the first double-sided copper clad laminate 11a, and covers and bonds the entire central portion 151a of the first adhesive sheet 15a and a portion of the peripheral portion 152a of the first adhesive sheet 15a surrounding the central portion 151a. The second copper foil 14a contacts the second double-sided copper clad laminate 12a, and covers and bonds the entire central portion 151a of the first adhesive sheet 15a and a portion of the peripheral portion 152a surrounding the central portion 151a. That is, the central portion 151a of the first adhesive sheet 15a and the first doubled-sided copper clad laminate 11a are spaced by the first copper foil 13a, and the central portion 151a and the second double-sided copper clad laminate 12a are spaced by the second copper foil 14a. A portion of the peripheral portion 152a which is not covered by the first copper foil 13a and the second copper foil 14a directly bonds the first copper clad laminate 11a and the second copper clad laminate 12a.

The supporting substrate 10a includes a first surface 101a and an opposite second surface 102a. A surface of the first copper layer 181a of the third copper foil 18a serves as the first surface 101a. A surface of the third copper layer 191a of the fifth copper foil 19a serves as the second surface 102a.

The supporting substrate 10a includes a product portion 103a and an unwanted portion 104a surrounding the product portion 103a. An orthogonal projection of the product portion 103a on the first adhesive sheet 15a has a same shape as the central portion 151a and an area equal to the central portion 151a. The orthogonal projection of the product portion 103a on the first adhesive sheet 15a is aligned with the central portion 151a.

In an alternative embodiment, the first and second copper foils 13a and 14a can be omitted. That is, opposite sides of the first adhesive 15a bond the first double-sided copper clad laminate 11a and the second double-sided copper clad laminate 12a with no space between. Correspondingly, the first adhesive sheet 15a is a peelable adhesive, such as a PET release film.

Figure 19:
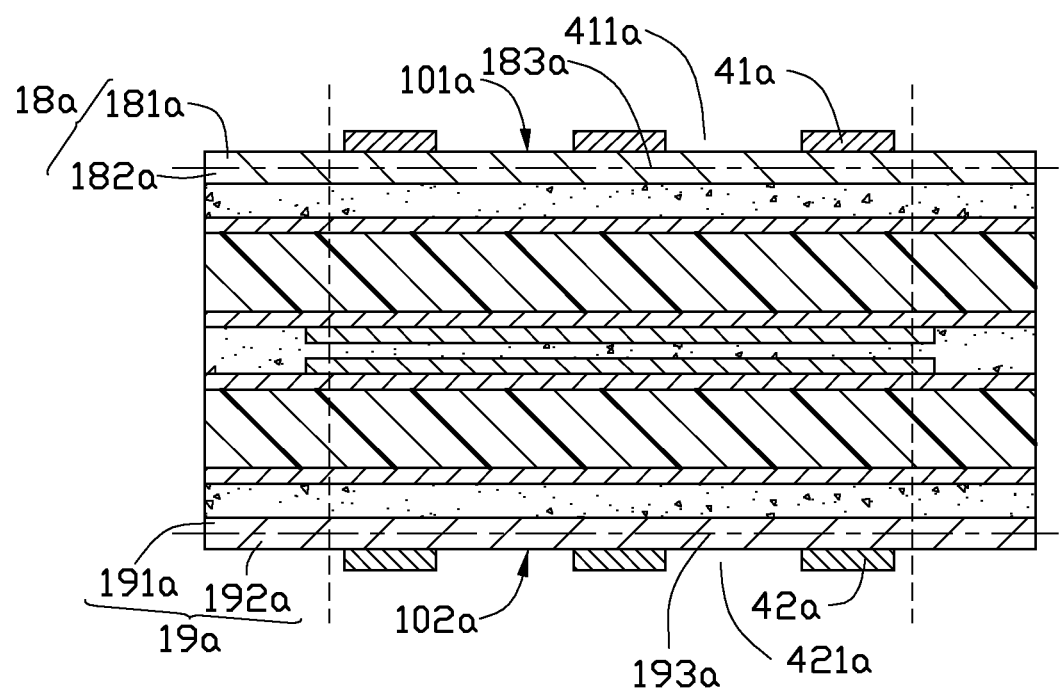
FIG. 19 shows a photo-resist layer formed on each of the third copper foil and the fifth copper foil in FIG. 18.
Figure 20:
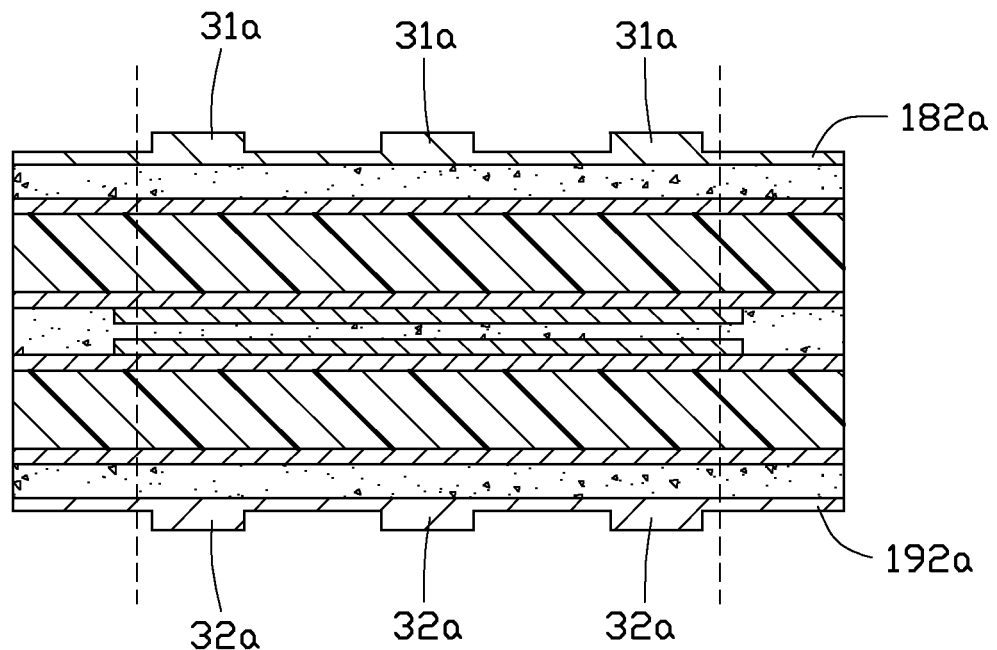
FIG. 20 shows connecting pads formed by partly etching the third and fifth copper foil in FIG. 19, and the photo-resist layers in FIG. 19 removed.

FIGS. 19-20 show that in step (3), a plurality of first connecting pads 31a is formed at the first surface 101a side, and a plurality of second connecting pads 32a is formed on the second surface 102a side. The first and second connecting pads 31a and 32a are located in the product portion 103a of the supporting substrate 10a.

A method for manufacturing the first connecting pads 31a and the second connecting pads 32a is described as follows. FIG. 19 shows that a first photo-resist layer 41a is formed on the first surface 101a, and a second photo-resist layer 42a is formed on the second surface 102a. The first photo-resist layer 41a defines a plurality of first openings 411a, which expose portions of the first copper layer 181a of the third copper foil 18a. The second photo-resist layer 42a defines a plurality of second openings 421a, which expose portions of the third copper layer 191a of the fifth copper foil 19a. FIG. 20 shows that the first copper layer 181a and the third copper layer 191a are etched based on the first and second photo-resist layers 41a and 42a, thereby forming the first connecting pads 31a and the second connecting pads 32a. Then the first and the second photo-resist layers 41a and 42a are removed. The etching depth of the third copper foil 18a is equal to the thickness of the first copper layer 181a. The etching depth of the fifth copper foil 19a is equal to the thickness of the third copper layer 191a. That is to say, the second copper layer 182a and the fourth copper layer 192a are not etched, and are respectively exposed through the gaps between the first connecting pads 31a and between the second connecting pads 32a.

Figure 21:
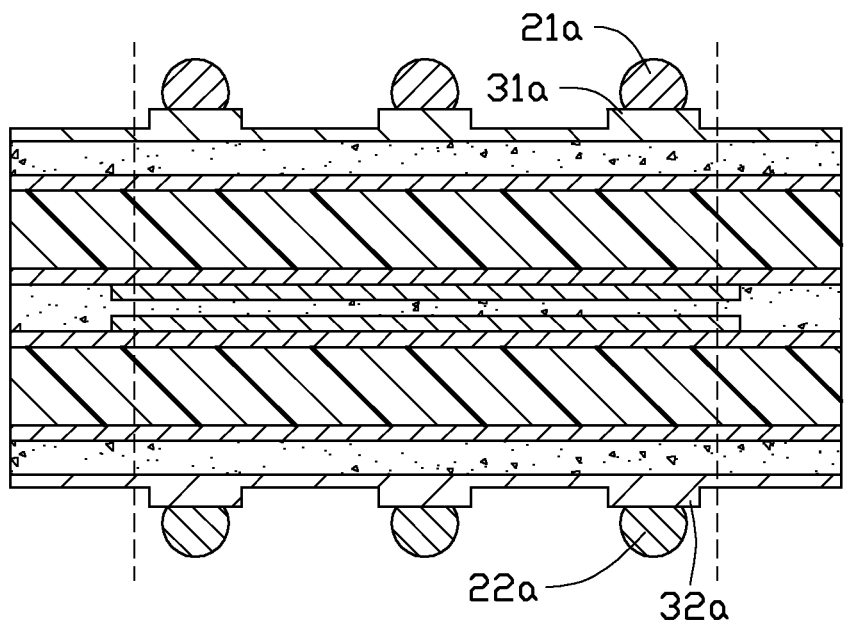
FIG. 21 shows solder balls formed on the connecting pads in FIG. 20.

FIG. 21 shows that in step (4), a first solder ball 21a is implanted on each of the first connecting pads 31a, and a second solder ball 22a is implanted on each of the second connecting pads 32a, using a method known in the art. The first and second solder balls 21a and 22a can be tin.

Figure 22:
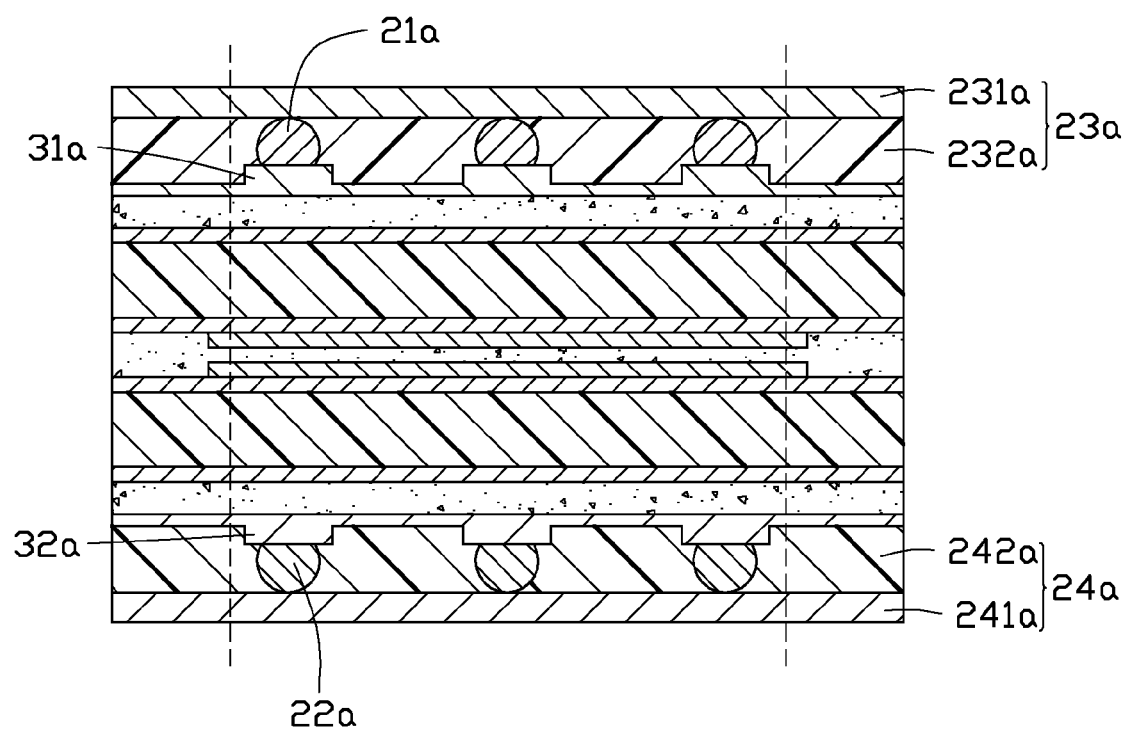
FIG. 22 shows a resin coated copper coil formed on each of the first and second copper foil substrates and the connecting pads in FIG. 21.

FIG. 22 shows that in step (5), a first resin coated copper foil 23a is laminated on the first solder balls 21a, and a second resin coated copper foil 24a is laminated on the second solder balls 22a. The first resin coated copper foil 23a includes a seventh copper foil 231a and a first resin layer 232a coated on a surface of the seventh copper foil 231a. The second resin coated copper foil 24a includes an eighth copper foil 241a and a second resin layer 242a coated on a surface of the eighth copper foil 241a. The first resin layer 232a covers surfaces of the first solder balls 21a and infills the gap between the first solder balls 21a. The second resin layer 242a covers surfaces of the second solder balls 22a and infills the gap between the second solder balls 22a. Terminal portions of the first solder balls 21a facing away from the first connecting pads 31a contact and are electrically connected to the seventh copper foil 231a. Terminal portions of the second solder balls 22a facing away from the second connecting pads 32a contact and are electrically connected to the eighth copper foil 241a.

Figure 23:
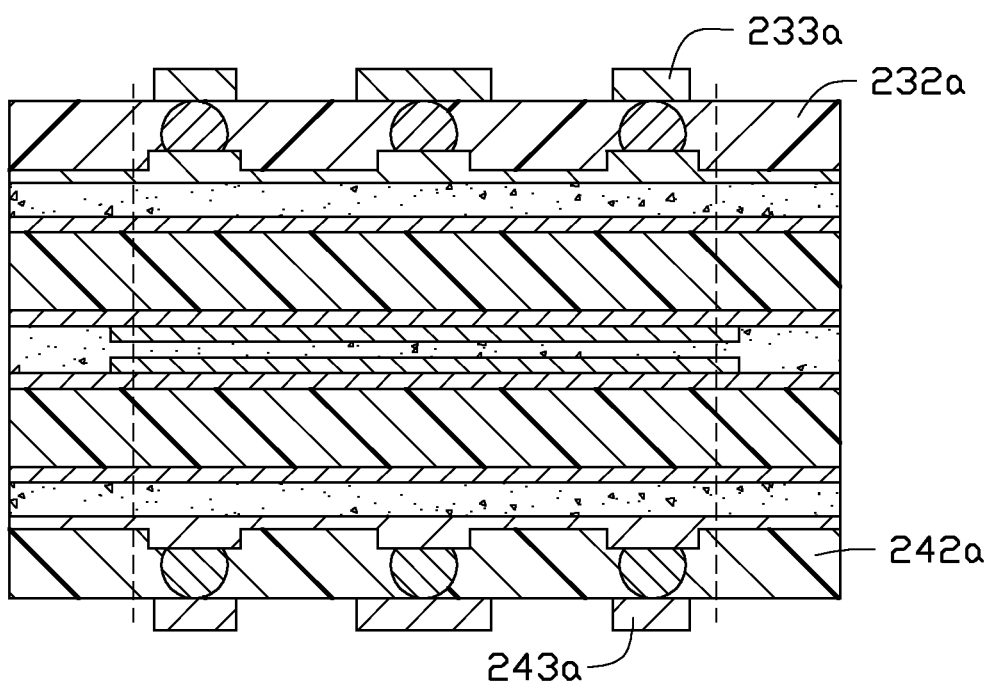
FIG. 23 shows copper foil layers of the resin coated copper in FIG. 22 partly removed to form wiring layers.

FIG. 23 shows that in step (6), the seventh copper foil 231a is selectively etched to form a patterned first wiring layer 233a, and the eighth copper foil 241a is selectively etched to form a patterned second wiring layer 243a.

Figure 24:
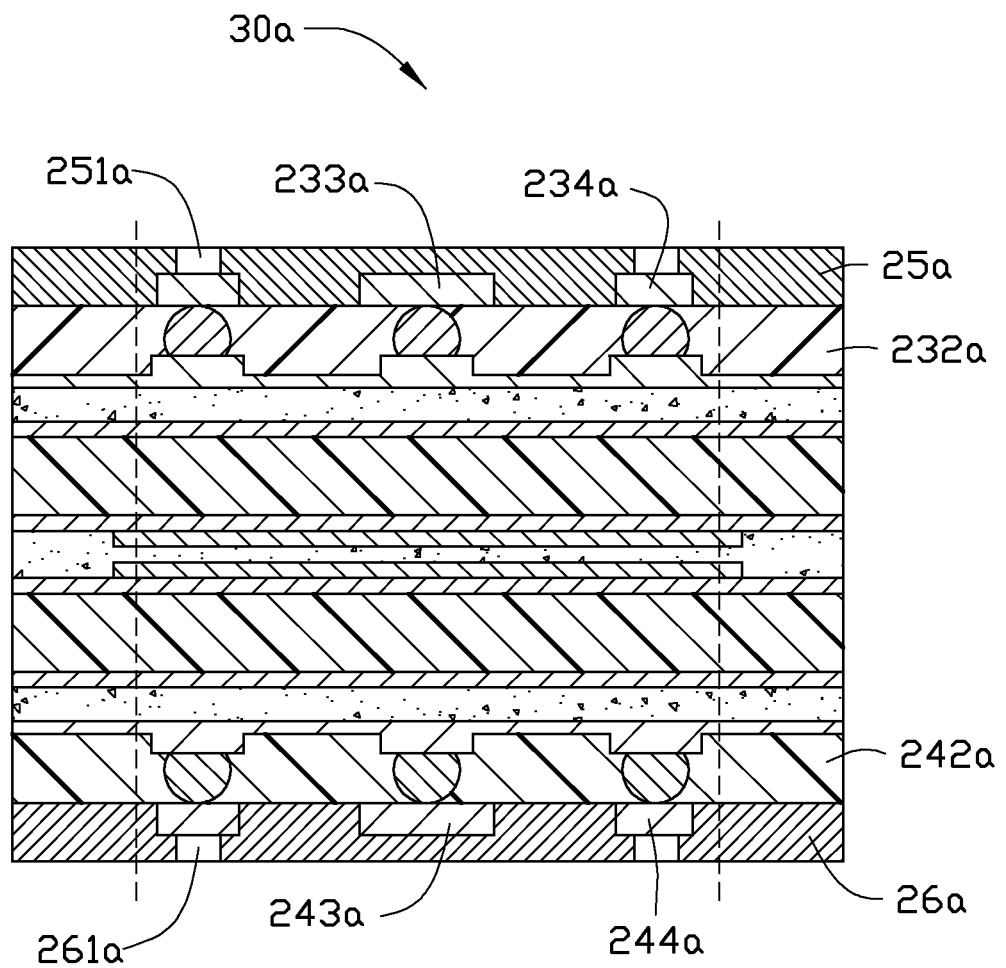
FIG. 24 shows solder mask layers covering the wiring layers in FIG. 23 and exposing contact pads.

FIG. 24 shows that in step (7), a first solder mask layer 25a is formed on the first wiring layer 233a, and a second solder mask layer 26a is formed on the second wiring layer 243a. Thus, a multi-layer structure 30a is obtained.

The first solder mask layer 25a defines a plurality of third openings 251a to expose portions of the first wiring layer 233a. The second solder mask layer 26a defines a plurality of fourth openings 261a to expose portions of the second wiring layer 243a. The portions of the first wiring layer 233a exposed through the third openings 251a serve as first contact pads 234a. The portions of the second wiring layer 243a exposed through the fourth openings 261a serve as second contact pads 244a. The first and second solder mask layers 25a and 26a can be formed by coating and then drying solder resist ink on the first wiring layer 233a and the second wiring layer 243a.

Figure 25:
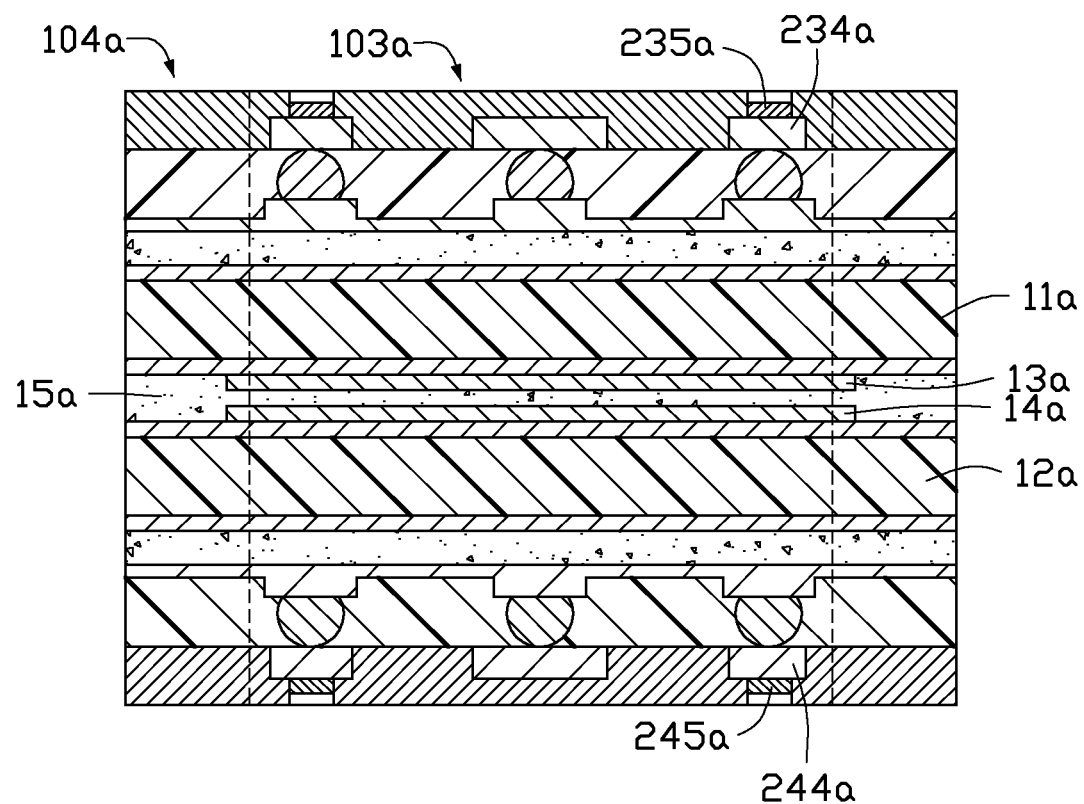
FIG. 25 shows surface plating layers formed on the contact pads in FIG. 24.

FIG. 25 shows that in step (8), a first surface plating layer 235a is formed on each of the first contact pads 234a, and a second surface plating layer 245a is formed on each of the second contact pads 244a.

The first surface plating layer 235a and the second surface plating layer 245a can be formed by a plating of gold, of nickel-gold, of nickel-palladium-gold or of tin. The first and second surface plating layers 235a and 245a protect the first and second contacts 234a and 245a from oxidation, and is beneficial for the connection to gold wires of a chip in a later step.

Figure 26:
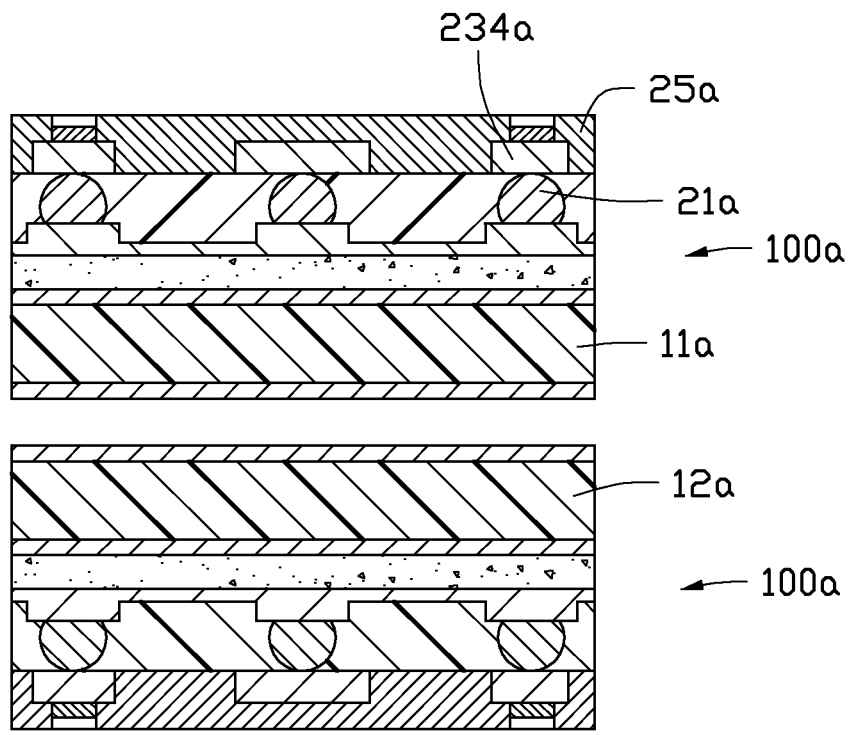
FIG. 26 shows the multilayer structure of FIG. 25 separated, obtaining a first packaging substrate and a second packaging substrate.

FIG. 26 shows that in step (9), a portion of the multi-layer structure 30a aligned with the unwanted portion 104a is removed. Thus, a first packaging substrate 100a and a second packaging substrate 200a are separated from each other are respectively obtained.

The portion of the multi-layer structure 30a aligned with the unwanted portion 104a is removed by cutting or punching the multi-layer structure 30a along a borderline between the product portion 103a and the unwanted portion 104a.

Because the first copper foil 13a and the second copper foil 14a cover the entire central portion 151a of the first adhesive sheet 15a, the first adhesive sheet 15a does not adhere to the first double-sided copper clad laminate 11a and the second double-sided copper clad laminate 12a in the product portion 103a after the unwanted portion 104a is removed. The first copper foil 13a and the first double-sided copper clad laminate 11a are easily separated from each other because there is no bonding between the first copper foil 13a and the first double-sided copper clad laminate 11a. Similarly, the second copper foil 14a and the second double-sided copper clad laminate 12a are easily separated from each other. Thus, the first double-sided copper clad laminate 11a and the second double-sided copper clad laminate 12a are separated from each other.

When the first and second copper foils 13a and 14a are omitted, the first packaging substrate 100a and the second packaging substrate 200a are separated from each other by removing the first adhesive sheet 15a, such as by peeling the first adhesive sheet.

The first packaging substrate 100a is identical to the second packaging substrate 200a. Thus, the first packaging substrate 100a is taken as an example for describing how a chip is mounted on the first packaging substrate 100a in the following steps.

Figure 27:
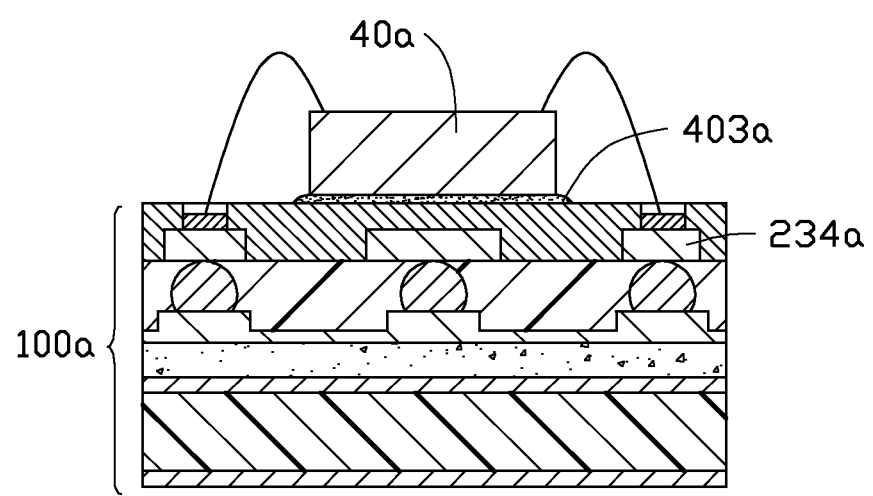
FIG. 27 shows a chip attached on the first packaging substrate in FIG. 26.
Figure 28:
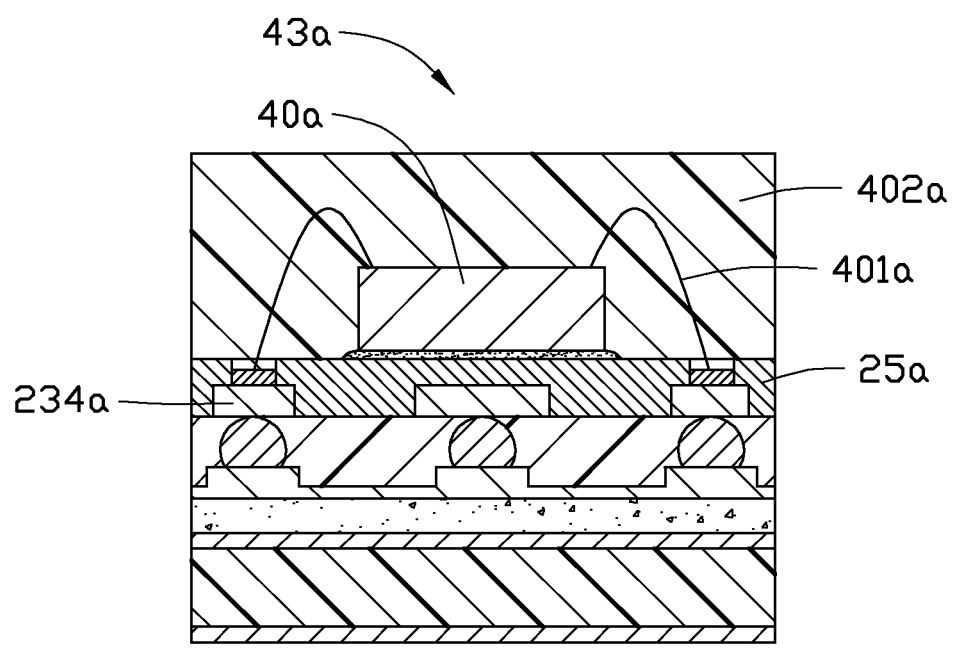
FIG. 28 shows a molding compound layer formed on the first packaging substrate and the chip in FIG. 27.

FIGS. 27 and 28 show that in step (10), a chip 40a is mounted on the first packaging substrate 100a and is electrically connected to the first packaging substrate 100.

In detail, FIG. 27 shows that the chip 40a is fixed on the first solder mask layer 25a through an adhesive layer 403a. The chip 40a includes a plurality of electrodes (not shown) and a plurality of bonding wires 401a connecting with the electrodes. A terminal portion of the bonding wires 401a is soldered to the surface plating layers 235a on the first contact pads 234a, thereby electrically connecting the chip 40a to the first wiring layer 233a. The bonding wires 401a can be gold. FIG. 13 shows that a molding compound layer 402a is applied on the chip 40a and the packaging substrate 100a to entirely cover the bonding wires 401a, the chip 40a, an exposed portion of the first solder mask layer 25a and the surface plating layers 235a on the first contact pads 234a. In this embodiment, the molding compound layer 402a can be thermosetting resin, for example, polyimide resin, epoxy resin, or silicone resin, for example.

Figure 29:
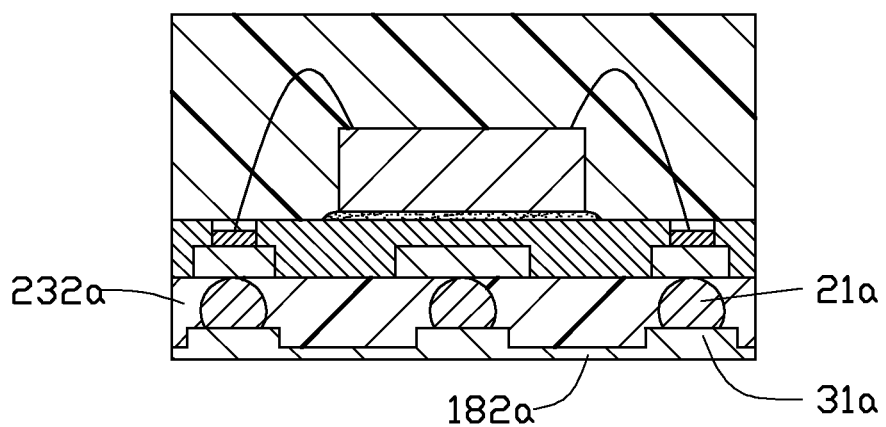
FIG. 29 shows the first copper clad laminate and the second adhesive sheet in FIG. 28 removed.

FIG. 29 shows that in step (11), the first double-sided copper clad laminate 11a, and the second adhesive sheet 16a are removed. The first double-sided copper clad laminate 11a and the second adhesive sheet 16a can be removed by peeling the second adhesive sheet 16a from the second copper layer 182a of the third copper foil 18a.

Figure 30:
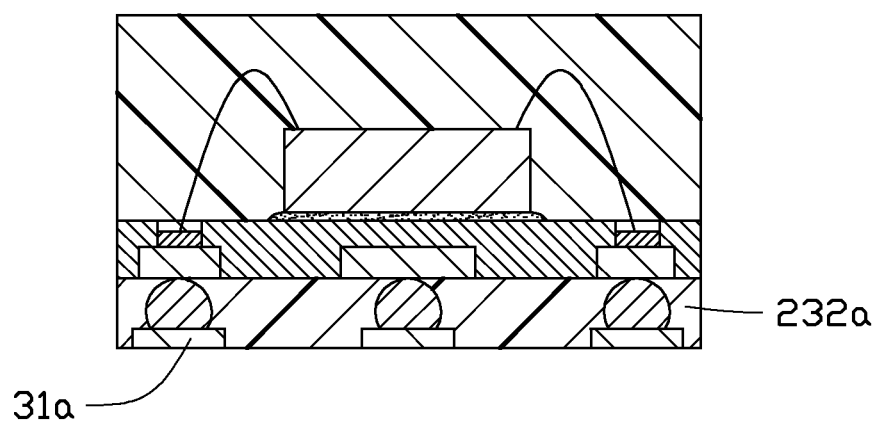
FIG. 30 shows a first copper layer attached on a first insulating layer in FIG. 29 removed.

FIG. 30 shows that in step (12), the second copper layer 182a of the third copper foil 18a is removed. The second copper layer 182a can be removed through a micro-etching method. Thus, the first contact pads 31 are exposed.

Figure 31:
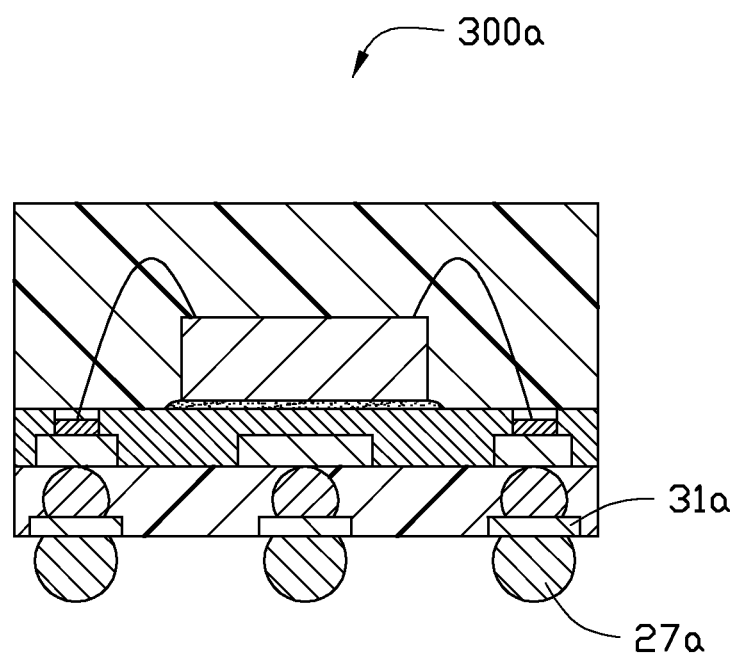
FIG. 31 shows solder balls formed on a side of the connecting pads in FIG. 30 facing away from the contact pads.

FIG. 31 shows that in step 13, a third solder ball 27a is implanted on each of the first contact pads 31a, thereby obtaining a chip packaging body 300a. The chip packaging body 300a is similar to the chip packaging body 300, the differences being that the connecting pads 31a are made by etching a copper foil.

While certain embodiments have been described and exemplified above, various other embodiments will be apparent from the foregoing disclosure to those skilled in the art. The disclosure is not limited to the particular embodiments described and exemplified but is capable of considerable variation and modification without departure from the scope and spirit of the appended claims.

What is claimed is:

1. A method for manufacturing a packaging substrate, comprising:

laminating a third copper foil, a second adhesive sheet, a first supporting sheet, a first adhesive sheet, a second supporting sheet, a third adhesive sheet and a fifth copper foil together in that order to form a supporting substrate;

forming a plurality of first connecting pads on the third copper foil, and forming a plurality of second connecting pads on the fifth copper foil;

forming a first solder ball on each of the first connecting pads, and forming a second solder ball on each of the second connecting pads;

laminating a first resin coated copper foil on the first solder balls, and a second resin coated copper foil on the second solder balls, the first resin coated copper foil comprising a seventh copper foil and a first resin layer formed on the seventh copper foil, the first resin layer covering surfaces of the first solder balls and filling gaps between the first solder balls, terminal portions of the first solder balls further away from the first connecting pads contacting and electrically connected to the seventh copper foil, the second resin coated copper foil comprising an eighth copper foil and a second resin layer formed on the eighth copper foil, the second resin layer covering surfaces of the second solder balls and filling the gap between the second solder balls, terminal portions of the second solder balls further away from the second connecting pads contacting and electrically connected to the eighth copper foil;

etching the seventh copper foil to form a patterned first wiring layer, and etching the eighth copper foil to form a patterned second wiring layer;

forming a first solder mask layer on the first wiring layer, and forming a second solder mask layer on the second wiring layer, thereby obtaining a multi-layer structure, the first solder mask defining a plurality of third openings, portions of the first wiring layer exposed through the third openings serving as first contact pads, the second solder mask defining a plurality of fourth openings, portions of the second wiring layer exposed through the fourth openings serving as second contact pads;

removing the first adhesive sheet, thereby obtaining a first packaging substrate and a second packaging substrate.

2. The method of claim 1, wherein the first supporting sheet is a first double-sided copper clad laminate, and the second supporting sheet is a second double-sided copper clad laminate, the method further comprises providing a first copper foil sandwiched between the first double-sided copper clad laminate and the first adhesive sheet, and a second copper foil sandwiched between the second double-sided copper clad laminate and the first adhesive sheet, the first double-sided copper clad laminate, the first adhesive sheet and the second double-sided copper clad laminate having a same area, the first adhesive sheet comprising a central portion and a peripheral portion surrounding the central portion, an area of each of the first copper foil and the second copper foil being smaller than that of the first adhesive sheet and greater than that of the central portion of the first adhesive sheet, the first and second copper foils each covering the entire central portion.

3. The method of claim 2, wherein the supporting substrate comprises a product portion and an unwanted portion surrounding the product portion, an orthogonal projection of the product portion on the first adhesive sheet having a same shape as the central portion and an area equal to the central portion, the orthogonal projection of the product portion on the first adhesive sheet aligned with the central portion, the step of removing the first adhesive sheet comprising: cutting or punching the multi-layer structure along a borderline between the product portion and the unwanted portion; and removing the first copper foil, the second copper foil and a portion of the first adhesive sheet sandwiched between the first copper foil and the second copper foil.

4. The method of claim 1, further comprising forming a first surface plating layer on each of the first contact pads, and a second surface plating layer on each of the second contact pads.

5. The method of claim 1, wherein the supporting substrate further comprises a first adhesive layer and a fourth copper foil between the third copper foil and the second adhesive sheet, and a second adhesive layer and a sixth copper foil between the fifth copper foil and the third adhesive sheet, the third copper foil and the fourth copper foil respectively arranged on opposite sides of the first adhesive layer, a thickness of the fourth copper foil being greater than that of the third copper foil, the fifth copper foil and the sixth copper foil respectively arranged on opposite sides of the second adhesive layer, a thickness of the sixth copper foil being greater than that of the fifth copper foil, the step of forming a plurality of first connecting pads on the third copper foil, and a plurality of second connecting pads on the fifth copper foil comprising:

forming a patterned first photo-resist layer on a surface of the third copper foil, and a patterned second photo-resist layer on a surface of the fifth copper foil, the first photo-resist layer defining a plurality of first openings to expose portions of the third copper foil, the second photo-resist layer defining a plurality of second openings to expose portions of the fifth copper foil;

filling the first openings through an electroplating method to form the first connecting pads, and filling the second openings through an electroplating method to form the second connecting pads; and removing the first and second photo-resist layers.

6. The method of claim 5, wherein a thickness of the third copper foil and the fifth copper foil are about 5 micrometers, and a thickness of the fourth copper foil and the sixth copper foil are about 18 micrometers.

7. The method of claim 1, wherein the third copper foil is a single body of material comprising an outer first copper layer and an underlying second copper layer, the fifth copper foil being a single body of material comprising an outer third copper layer and an underlying fourth copper layer, the step of forming a plurality of first connecting pads on the third copper foil, and a plurality of second connecting pads on the fifth copper foil comprises:

forming a patterned first photo-resist layer on a surface of the third copper foil, and a patterned second photo-resist layer on a surface of the fifth copper foil, the first photo-resist layer defining a plurality of first openings to expose portions of the third copper foil, the second photo-resist layer defining a plurality of second openings to expose portions of the fifth copper foil;

etching the first copper layer through the first openings, and the etching the third copper layer through the second openings, portions of the first copper layer covered by the patterned first photo-resist layer serving as the first connecting pads, portions of the third copper layer covered by the patterned second photo-resist layer serving as the second connecting pads; and removing the first and second photo-resist layers.

* * * * *